(12) United States Patent
Fukagawa

(10) Patent No.: US 6,510,446 B1
(45) Date of Patent: Jan. 21, 2003

(54) FLOATING POINT CALCULATION METHOD AND UNIT EFFICIENTLY REPRESENTING FLOATING POINT DATA AS INTEGER AND SEMICONDUCTOR INTEGRATED CIRCUIT DEVICE PROVIDED WITH THE SAME

(75) Inventor: Shuji Fukagawa, Hyogo (JP)

(73) Assignee: Mitsubishi Denki Kabushiki Kaisha, Tokyo (JP)

(*) Notice: Subject to any disclaimer, the term of this patent is extended or adjusted under 35 U.S.C. 154(b) by 0 days.

(21) Appl. No.: 09/444,845

(22) Filed: Nov. 22, 1999

(30) Foreign Application Priority Data

Jun. 9, 1999 (JP) ............................................. 11-162056

(51) Int. Cl.$^7$ ............................. G06F 7/38; G06F 15/00
(52) U.S. Cl. ........................................ 708/497; 708/204
(58) Field of Search ................................. 708/496–497, 708/204

(56) References Cited

U.S. PATENT DOCUMENTS

| | | | |
|---|---|---|---|
| 4,258,943 A | | 11/1993 | Gamez et al. |
| 5,258,943 A | * | 11/1993 | Gramez et al. |
| 5,303,175 A | * | 4/1994 | Suzuki ........................ 708/496 |
| 6,128,726 A | * | 10/2000 | LeComec .................... 708/204 |
| 6,219,684 B1 | * | 4/2001 | Saxena et al. .............. 708/497 |
| 6,334,442 B1 | * | 11/2001 | Suzuki ........................ 708/497 |

FOREIGN PATENT DOCUMENTS

JP          5-250143          9/1993

* cited by examiner

*Primary Examiner*—Tan V. Mai
(74) *Attorney, Agent, or Firm*—McDermott, Will & Emery

(57) ABSTRACT

A floating point calculation method according to the present invention includes steps of: receiving input data; performing calculation for data for an exponent portion of the input data for outputting a calculation result; branching into cases in accordance with the calculation result for setting a value of each bit of output data in accordance with a combination of a designation signal designating by which one of rounding up and rounding down the integer representation is to be performed and a sign bit of the input data; and outputting the output data.

14 Claims, 20 Drawing Sheets

FIG. 3

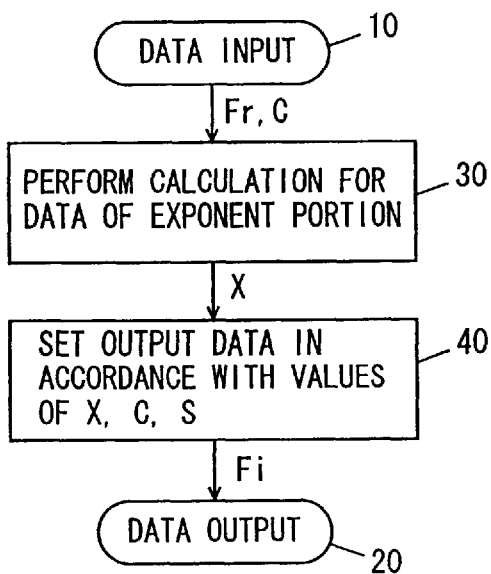

FIG. 4

| VALUE OF X | DESIGNATION | INPUT DATA IS POSITIVE | INPUT DATA IS NEGATIVE |
|---|---|---|---|
| X<0 | ROUND DOWN | FLOATING POINT REPRESENTATION OF 0 | FLOATING POINT REPRESENTATION OF −1 |
| | ROUND UP | FLOATING POINT REPRESENTATION OF 1 | FLOATING POINT REPRESENTATION OF 0 |
| 0<=X <=23 | ROUND DOWN | SET "ROUNDED DOWN DATA" ... (A) | SAME AS (B) |
| | ROUND UP | SET "ROUNDED DOWN DATA" + "INCREMENT DATA" ... (B) | SAME AS (A) |
| 23<X | COMMON | DIRECTLY SET INPUT DATA (ALREADY INTEGER WITHOUT PROCESS) | |

FIG. 8

| SIGN BIT<br>DESIGNATION SIGNAL | S=1 (NEGATIVE) | | S=0 (POSITIVE) | |
|---|---|---|---|---|
| C=1 (DESIGNATION OF ROUNDING UP) | (−) | FIXED DATA 「0」 | + | FIXED DATA 「1」 |
| C=0 (DESIGNATION OF ROUNDING DOWN) | − | FIXED DATA 「1」 | (+) | FIXED DATA 「0」 |

↑ SIGN BIT  ↑ EXPONENT PORTION · SIGNIFICAND PORTION

FIG. 9

| SIGN BIT<br>DESIGNATION SIGNAL | S=1 (NEGATIVE) | | S=0 (POSITIVE) | |
|---|---|---|---|---|
| C=1 (DESIGNATION OF ROUNDING UP) | − | ROUNDED DOWN DATA | + | ROUNDED UP DATA |
| C=0 (DESIGNATION OF ROUNDING DOWN) | − | ROUNDED UP DATA | + | ROUNDED DOWN DATA |

↑ SIGN BIT  ↑ EXPONENT PORTION · SIGNIFICAND PORTION

F I G. 2 1
| SIGN BIT<br>DESIGNATION SIGNAL | S=1 (NEGATIVE) | S=0 (POSITIVE) |
|---|---|---|
| C=1 (DESIGNATION OF ROUNDING UP) | ALL BITS "0" | INCREMENT DATA |
| C=0 (DESIGNATION OF ROUNDING DOWN) | INCREMENT DATA | ALL BITS "0" |
F I G. 2 9    PRIOR ART
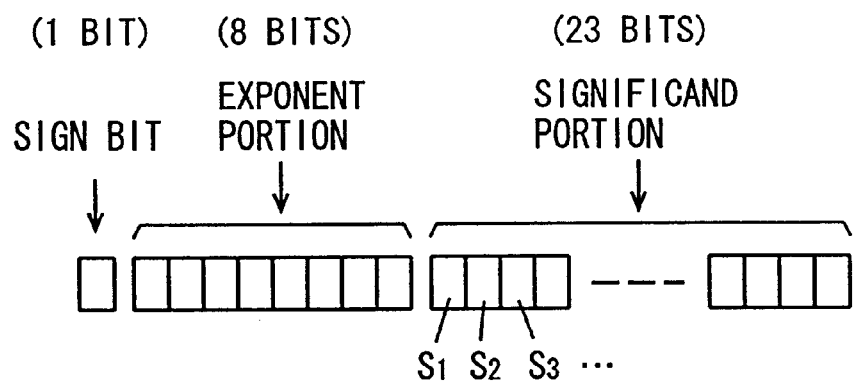

FLOATING POINT CALCULATION METHOD AND UNIT EFFICIENTLY REPRESENTING FLOATING POINT DATA AS INTEGER AND SEMICONDUCTOR INTEGRATED CIRCUIT DEVICE PROVIDED WITH THE SAME

BACKGROUND OF THE INVENTION

1. Field of the Invention

The present invention relates to floating point data calculation methods, and more specifically to a floating point calculation method and unit capable of efficiently performing a process of calculating floating point data to obtain integer data in floating point notation (the process is hereinafter referred to as integer representation) by rounding up or rounding down fractions below decimal point of floating point data and a semiconductor integrated circuit device provided with the same.

2. Description of the Background Art

As a numerical value must be represented as digital data having a prescribed number of bits in a calculator, real number data is generally represented as floating point data.

For the floating point data, a format having 32-bit length is generally employed in accordance with the IEEE standard.

FIG. 29 is a schematic diagram showing a structure of single-precision floating point data in accordance with the IEEE standard.

Referring to FIG. 29, the single-precision floating point data in accordance with the IEEE standard includes a sign bit of 1 bit, an exponent portion of 8 bits and a significand portion of 23 bits. A real number Z represented as floating point data is generally shown by the following equation (1).

$$Z=(-1)^S \times (1+F) \times 2^{(e-b)} \qquad (1)$$

In the above equation (1), F represents fractions below decimal point represented by the significand portion of 23 bits. S corresponds to data of the sign bit, and e corresponds to a decimal number representation of the exponent portion of 8 bits. A bias value in the case of an exponent is represented by b, for which a predetermined value is used in accordance with the standard. For example, b=127 in the single-precision floating point data, and b=1023 in double-precision floating point data.

In other words, if the bits of the significand portion are sequentially numbered as s1, s2, s3, ..., starting from the first bit, the above equation (1) is expanded as the following equation (2).

$$(-1)^s \times (1+(s1 \times 2^{-1})+(s2 \times 2^{-2})+(s3 \times 2^{-3})+\ldots) \times 2^{(e-b)} \qquad (2)$$

Thus, real number data in a wide range can be represented with high precision by a combination of the exponent and significand portions using the floating point data.

When calculation for image processing or the like is to be performed in the calculator, in some cases, a process of representing given real number data as an integer by rounding down or rounding up data corresponding to fractions below decimal point must frequently be performed at high speed.

As the floating point data is used to represent a real number value in a wide range by a combination of the exponent and significand portions, the number of digits of the data corresponding to the fractions below decimal point of the real number data differs from combination of the exponent and significand portions. Therefore, some special method must be used to efficiently perform integer representation of the floating point data.

SUMMARY OF THE INVENTION

An object of the present invention is to provide a floating point calculation method and unit capable of efficiently performing integer representation of floating point data by rounding down or rounding up fractions below decimal point and to provide a structure of a semiconductor integrated circuit device provided with the same.

In short, the present invention relates to a floating point calculation method performing integer representation of floating point data of a binary number including an exponent portion of M bits A: a natural number) and a significand portion of N bits (N: a natural number). The floating point calculation method includes steps of: outputting a calculation result X (X: an integer) obtained by subtracting a prescribed bias value from a decimal number value corresponding to the exponent portion of input data; and setting each bit of output integer data obtained by representing the input data as an integer in accordance with a combination of calculation result X, a sign of the input data and an integer representation designation signal designating by which one of rounding up and rounding down the integer representation is to be performed.

According to another aspect of the present invention, the present invention relates to a floating point calculation unit performing integer representation of floating point data of a binary number having a sign bit, an exponent portion of M bits (M: natural number) and a significand portion of N bits (N: natural number). The floating point calculation unit includes an input circuit, an exponent portion calculating circuit, an integer-represented data setting circuit and an output circuit.

The input circuit receives input data. The exponent portion calculating circuit outputs a calculation result X (X: integer) obtained by subtracting a prescribed bias value from a decimal number value corresponding to the exponent portion of the input data. The integer-represented data setting circuit receives the input data and sets each bit of output integer data in accordance with a combination of calculation result X, a sign of the input data and the integer representation designation signal designating by which one of rounding up and rounding down the integer representation is to be performed. The output circuit outputs the output integer data.

According to still another aspect, the present invention relates to a semiconductor integrated circuit device performing a prescribed data process in accordance with an externally applied designation signal. The semiconductor integrated circuit device includes an input/output circuit, a control circuit, a memory circuit, a system bus and a dedicated calculating circuit.

The input/output circuit externally transmits/receives a signal. The control circuit generates an internal control signal to perform a process corresponding to an instruction signal. The memory circuit stores data. The system bus transmits the designation signal and data to each circuit in the semiconductor integrated circuit device. The dedicated calculating circuit has a function of performing integer representation of floating point data of the binary number.

The dedicated calculating circuit includes: a logic circuit controlling an operation of the dedicated calculating circuit in accordance with the internal control signal: a sub memory circuit storing data in accordance with an instruction of the logic circuit; and a floating point calculating circuit performing integer representation of the floating point data in accordance with the instruction of the logic circuit. The floating point data includes a sign bit, an exponent portion of M bits (M: a natural number) and a significand portion of N bits (N: a natural number). The floating point calculating circuit includes: an input circuit receiving input data; an exponent portion calculating circuit outputting a calculation result X (X: an integer) obtained by subtracting a prescribed bias value from a decimal number value corresponding to the exponent portion of the input data; an integer-represented data setting circuit setting each bit of the output integer data in accordance with a combination of calculation result X, a sign of the input data and an integer representation designation signal designating by which one of rounding up and rounding down the integer representation is to be performed; and an output circuit outputting the output integer data.

Thus, a main advantage of the present invention is that the integer representation can be performed at high speed as integer representation of the floating point data by rounding up or rounding down is performed without a step of converting the format of the floating point data to that of fixed point data.

In addition, as the calculation unit performing integer representation of the floating point data is obtained only by a circuit which processes data having the same number of bits as that of the input circuit without data format conversion, integer representation of the floating point data can be performed at high speed by a small circuitry which is advantageous in terms of a layout.

Further, the floating point calculation unit is provided which is capable of performing integer representation of the floating point data only by a circuit which processes data having the same number of bits as that of the input data without data format conversion. Therefore, the semiconductor integrated circuit device is capable of efficiently and frequently performing the integer representation of the data at high speed.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 3 is a flow chart schematically showing a floating point calculation method according to the first embodiment of the present invention.

FIG. 4 is a table shown in conjunction with different cases in a method of performing integer representation for calculation result X.

FIG. 8 is a diagram shown in conjunction with a method of setting output integer data corresponding to a combination of a sign bit S and a designation signal C in a step 43.

FIG. 9 is a diagram shown in conjunction with a method of setting each bit of the output integer data corresponding to a combination of sign bit S and designation signal C in a step 42.

FIG. 21 is a diagram shown in conjunction with a method of setting selection increment data in increment data generating circuit 142.

FIG. 29 is a schematic diagram showing a structure of single-precision floating point data in accordance with the IEEE standard.

DESCRIPTION OF THE PREFERRED EMBODIMENTS

Figure 1:
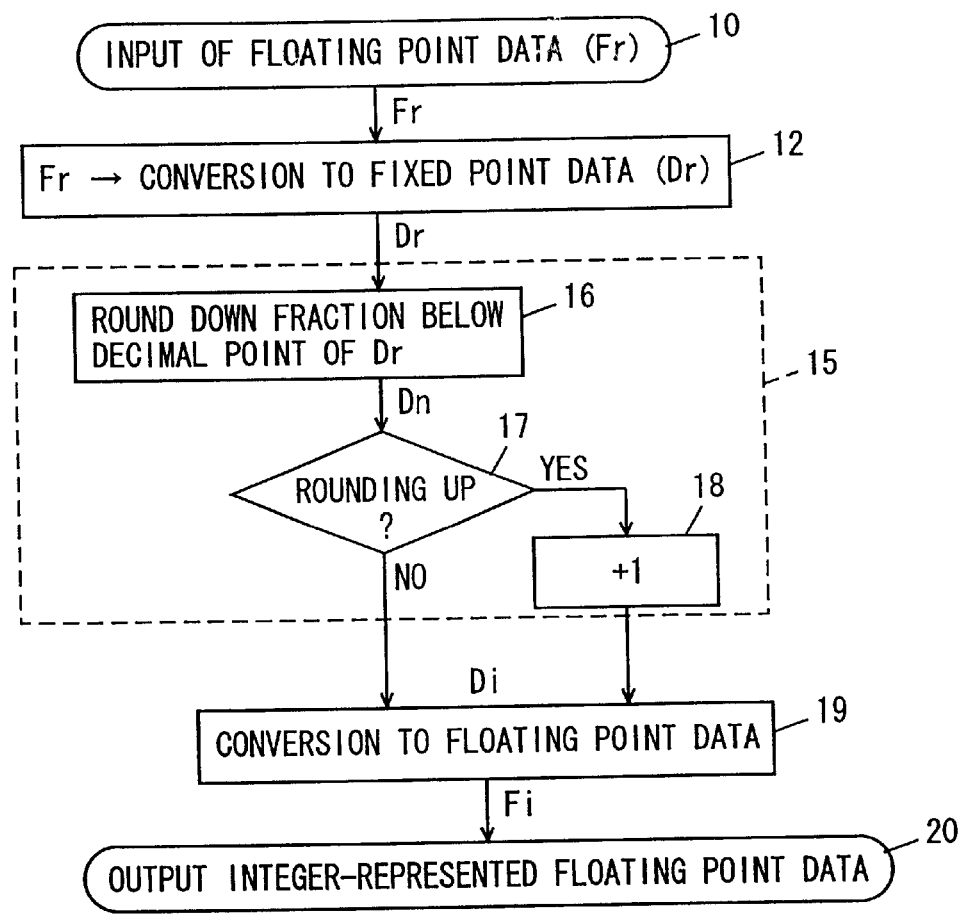
FIG. 1 is a flow chart showing a floating point calculation method shown in conjunction with a first embodiment of the present invention.

Embodiments of the present invention will now be described in detail with reference to the drawings. It is noted that the same or corresponding portions are denoted by the same reference numerals in the drawings.

Integer Representation with Data Format Conversion

In a floating point calculation method shown in FIG. 1, floating point data as input data is converted to fixed point data, rounding up or rounding down of fractions below decimal point is performed for the fixed point data having a prescribed number of bits representing fractions below decimal point, and the resulting integer value data is converted back to the floating point data.

The floating point calculation method shown in FIG. 1 includes: a step 10 of inputting floating point data Fr; a step 12 of converting input data Fr to fixed point data Dr; and a step 15 of converting fixed point data Dr of a real number to integer-represented data Di by rounding down or rounding up fractions below decimal point.

Step 15 includes: a step 16 of rounding down the fractions below decimal point of fixed pointed data Dr for outputting intermediate data Dn; a step 17 of outputting intermediate data Dn as integer-represented data Di when integer representation by rounding down is designated; and a step 18 of adding 1 to intermediate data Dn for output as integer-represented data Di when integer representation by rounding up is designated.

Integer-represented data Di from step 17 or step 18 is converted back to the floating point data by step 19. As a result, integer-represented floating point data Fi is obtained, which corresponds to output integer data in FIG. 20.

Figure 2:
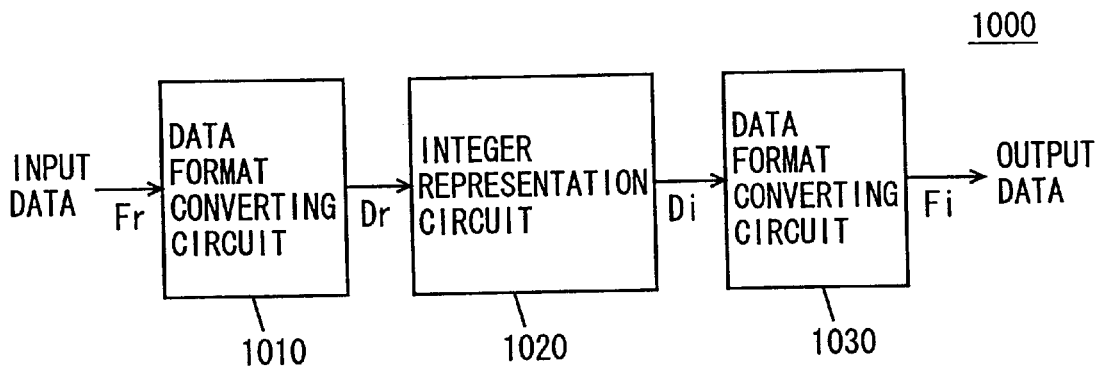
FIG. 2 is a block diagram showing a structure of a floating point calculation unit 1000 performing the floating point calculation method shown in FIG. 1.

Referring to FIG. 2, a floating point calculation unit 1000 includes: a data format converting circuit 1010 receiving floating point data Fr as input data for converting it to fixed point data Dr; an integer representation circuit 1020 receiving fixed point data Dr for obtaining integer-represented data Di by rounding down or rounding up fractions below decimal point of Dr; and a data format converting circuit 1030 converting integer-represented data Di back to the floating point data for outputting output integer data Fi.

The function of data format converting circuit 1010 corresponds to step 12 in FIG. 1. Similarly, integer representation circuit 1020 and data format converting circuit 1030 respectively correspond to steps 15 and 19.

If the floating point data is converted to the fixed point data, the number of bits to be rounded up or rounded down of the fractions below decimal point is rendered constant. Thus, integer representation of the floating point data can be performed by the same circuit.

First Embodiment

However, in the case of integer representation by the floating point calculation method described with reference to FIGS. 1 and 2, to perform data format conversion corresponding to steps 12 and 19 in FIG. 1 twice, circuits corresponding to data format converting circuits 1010 and 1030 must be provided. In addition, it is difficult to perform the operation at high speed.

Further, to perform integer representation of real number data in a wide range, a bit width of the intermediate fixed point data must be large. As a result, a gate scale of integer representation circuit 1020 would also be large.

The floating point calculation method according to a first embodiment of the present invention particularly deals with an exponent portion of the floating point data, and efficiently performs integer representation of the floating point data by providing a suitable processing step in accordance with a value of the exponent portion.

It is noted that although single-precision data with 32-bit length is used as the floating point data in accordance with the IEEE standard in the embodiment of the present invention, the present invention is not limited to this, as will later be described. In other words, the present invention can be applied to other floating point data with larger bit length by suitably changing a bit number or bias value.

In the floating point calculation method according to the first embodiment, integer representation is performed for input data Fr in a floating point format in accordance with designation signal C designating by which one of rounding up and rounding down the integer representation is to be performed and, data for each bit of output integer data Fi is set. 1 and 0 are respectively set when integer representation by rounding up and that by rounding down are designated by designation signal C.

Referring to FIG. 3, the floating point calculation method according to the first embodiment includes: a step 10 of receiving input data Fr; a step 30 of performing calculation for the exponent portion of input data Fr; a step 40 of setting a sign bit and values of the bits of the exponent and significand portions of outputting integer data Fi; and a step 20 outputting output integer data Fi.

In the floating point calculation method according to the first embodiment, calculation is performed for the exponent portion of the input data as described with reference to FIG. 3. The calculation relates to a simple integer calculation in accordance with the following equation (3).

$$X = e - 127 \quad (3)$$

In the above equation (3), e represents a decimal number representation value of 8-bit data for the exponent portion of input data Fi. Calculation result X is obtained by subtracting a bias value from e. As the single-precision floating point data is considered in the present embodiment, the bias value is 127 as shown in the above equation (3).

Integer representation by rounding down or rounding up fractions below decimal point can efficiently be performed for the floating point data in accordance with any of three cases depending on calculation result X.

Referring to FIG. 4, assume three cases of X<0, 0≦X≦23 and X>23 for calculation result X. In each of the cases, output integer data differing from combination of the sign bit of the input data and a value of designation signal C is set. Among the numbers serving as reference values for branching into the above mentioned cases, 23 corresponds to the bit number of the significand portion of the floating point data.

First, when X>0, the decimal number representation of the data represented by input floating point data Fr is −1<Fr<1. In other words, in this case, output integer data is fixed in any of the cases of rounding down and rounding up. More specifically, the floating point data corresponding to any one of −1, 0 and 1 of the decimal number representation is set as output integer data Fi in accordance with a combination of the sign bit of the input data and a rounding down/rounding up signal.

When X>23, that is, when a value of X exceeds the bit number of the significand portion, it means that data for fractions below decimal point is not included in the data for the significand portion. In this case, the fractions below decimal point are not rounded down or rounded up and, integer-represented floating point data can be obtained by directly setting each bit of the input data to each bit of output integer data Fi. When 0≦X≦23, rounded down data corresponding to the data of which fractions below decimal point of the input data have been rounded down is obtained by setting a value of the significand portion at and the (X+1)th bit and the following bits to 0 while leaving sign bit S, all of the bit of the exponent portion and values of the upper X bits of significand portion bit F as they are FIG. 5 corresponds to the case where calculation result X=3. In this case, the bits of the input data are directly input to the sign bit of the rounded down data, 8 bits of the exponent portion and the upper 3 bits of the significand portion. On the other hand, 0 is forced to be set to each of 4 to 23 bits of the significand portion of the rounded down data. Thus, the rounded down data is set in a state in which the data corresponding to the fractions below decimal point of the real number data represented by the input data has been rounded down.

By adding 1 to an integer value represented by the rounded down data, the rounded up data corresponding to the data obtained by rounding up the fractions below decimal point of the input data can be obtained by adding the above mentioned rounded down data to the increment data set in accordance with calculation result X.

Figure 5:
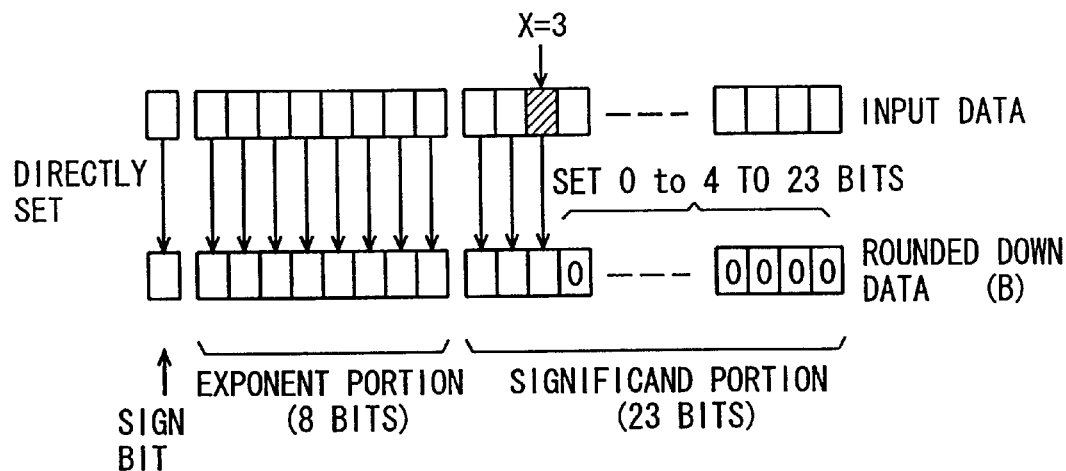
FIG. 5 is a diagram shown in conjunction with a method of setting rounded down data.
Figure 6:
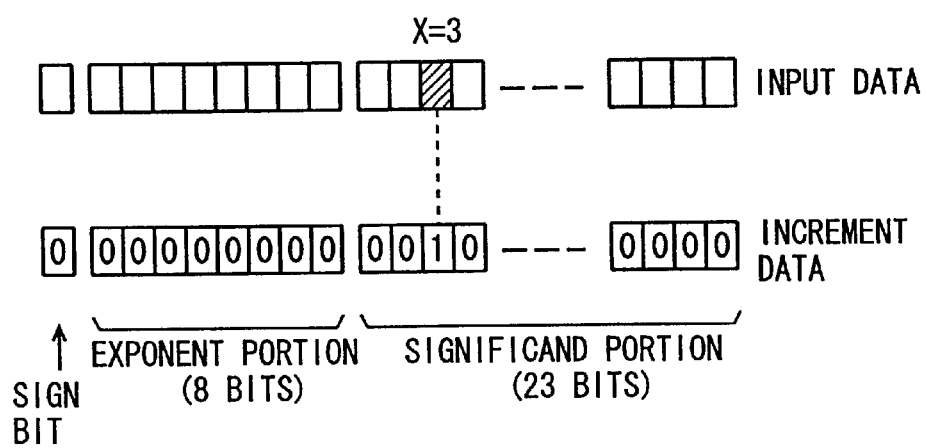
FIG. 6 is a diagram shown in conjunction with a method of setting increment data.

FIG. 6 also corresponds to the case where calculation result X=3. In this case, 1 is set to the third bit of the significand portion of the increment data and, 0 is set to each of the other bits. Thus, the increment data is obtained which has 1 at the bit of the significand portion corresponding to calculation result X and has 0 at all the other bits. By adding the rounded down data to the increment data as described with reference to FIG. 5, a value obtained by adding 1 to an integer value represented by the rounded down data, that is, rounded up data, can be obtained.

When 0≦X≦23, one of the above mentioned rounded up data and rounded down data is selected in accordance with a combination of sign bit S of the input data and designation signal C, and the output integer data is set.

When input data Fr is a positive value (that is, sign bit S=0), if integer representation by rounding down is designated by designation signal C, the rounded down data is directly set as the exponent and significand portions of output integer data Fi ((A) in FIG. 4). On the other hand, if integer representation by rounding up is designated by designation signal C, the rounded up data obtained by adding the rounded down data to the increment data is set as the exponent and significand portions of output integer data Fi ((B) in FIG. 4). The sign bit of the output integer data may be set to the same value as that of sign bit S of the input data.

When input data Fr is a negative value (S=1), the processes corresponding to the rounding up and rounding down are reversed with the case where the input data is a positive value. In other words, when integer representation by rounding down is designated by designation signal C, the rounded up data is set as the data for the exponent and significand portions as in the case of (B) in FIG. 4, and 1 is directly set to sign bit S. When integer representation by rounding up is designated by designation signal C, the rounded down data is set as the exponent and significand portions as in the case of (A) in FIG. 4, and 1 is set to sign bit S to obtain output integer data.

As described above, the process proceeds in accordance with the case depending on calculation result X, and the sign bit and each bit of the exponent and significand portions of the output integer data are set in accordance with a combination of sign bit S and designation signal C. Thus, integer representation of the input floating point data can be performed without conversion to the fixed point data.

Figure 7:
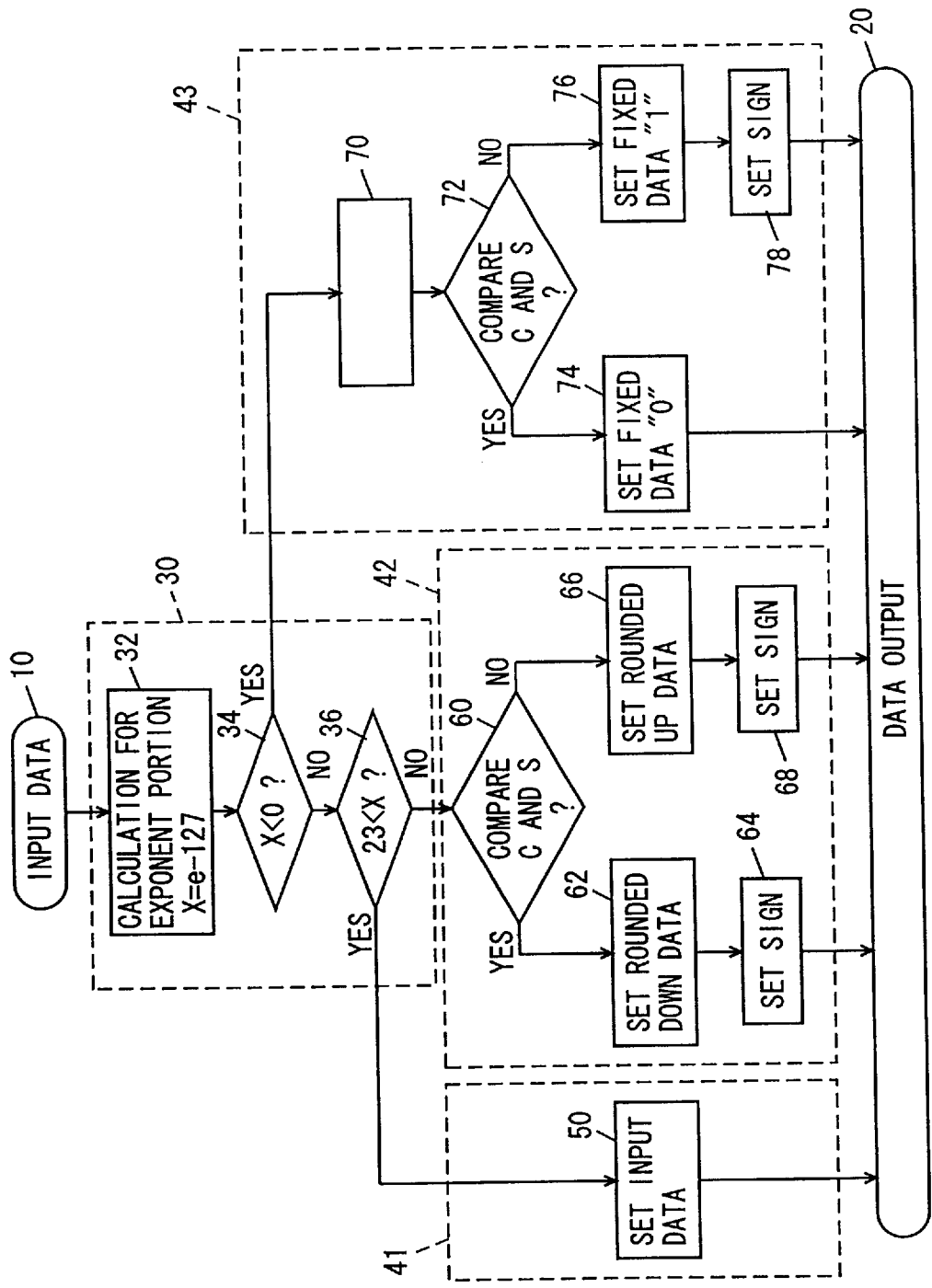
FIG. 7 is a flow chart showing in detail the floating point calculation method according to the first embodiment.

Referring to FIG. 7, the floating point calculation method according to the first embodiment includes: a step 10 of inputting the floating point data; a step 30 of performing calculation for the exponent portion data; and steps 41, 42 and 43 of setting each bit of output integer data Fi in accordance with a value of calculation result X.

Step 30 includes: a step 32 of performing calculation in accordance with the above equation (3); and steps 34 and 36 of branching into the cases of X≦0, 0≦X≦23 and 23<X depending on calculation result X.

Step 41 includes a step 50 of setting each bit of outputting the data Fi when X>23. Step 50 sets each bit of output integer data Fi to a value equal to each bit of input data Fr.

Step 43 sets each bit of output integer data Fi when X<0.

Step 43 includes: a step 70 of setting data for exponent and significand portions of the floating point data corresponding to 1 and 0 of the decimal number representation; and a step 72 of determining if designation signal C and sign bit S of the input data match.

FIG. 8 is a diagram shown in conjunction with a method of setting output integer data Fi corresponding to a combination of input data sign bit S and designation signal C in step 43.

Referring to FIG. 8, as described in conjunction with FIG. 4, if the input data is negative (S=1) and integer representation by rounding up (C=1) has been designated and if the input data is positive (S=0) and integer representation by rounding down (C=0) has been designated, the floating point data corresponding to 0 of decimal number representation may be set as the output integer data. In these cases, sign bit S and designation signal C match.

On the other hand, if input data is negative (S=1) and integer representation by rounding down (C=0) has been designated and if input data is positive (S=0) and integer representation by rounding up (C=1) has been designated, the floating point data corresponding to 1 of the decimal number representation is applied as fixed data for the data of the exponent and significand portions of the output integer data, and the sign bit of the output integer data may be set in accordance with the sign of the input data. In these cases, sign bit S and designation signal C do not match. Returning to FIG. 7, a step 43 includes: a step 74 of setting the fixed data "0" to each bit of the exponent and significand portions of the output integer data when sign bit S and designation signal C match; a step 76 of setting data corresponding to the fixed data "1" to each bit of the exponent and significand portions of the output integer data when sign bit S and designation signal C do not match; and a step 78 of setting the sign bit of output integer data Fi in accordance with the sign of the input data.

Step 42 sets the output integer data when 0≦X≦23.

Referring to FIG. 9, if the input data is negative (S=1) and integer representation by rounding up (C=1) has been designated and if the input data is positive (S=0) and integer representation by rounding down (C=0) has been designated, the rounded down data is set to each bit of the exponent and significand portions of the output integer data as described in conjunction with (A) of FIG. 4, and the sign bit may be determined in accordance with the sign bit of the input data. On the other hand, if the input data is negative (S=1) and integer representation by rounding down (C=0) has been designated and if the input data is positive (S=0) and integer representation by rounding up (C=1) has been designated, the rounded up data which has been described in conjunction with (B) of FIG. 4 is set to the exponent and significand portions of the output integer data, and the sign bit may be determined in accordance with the sign bit of the input data.

In the former case, sign bit S and designation signal C match. In the latter case, sign bit S and designation signal C do not match.

Step 42 includes: a step 60 of determining if designation signal C and sign bit S match; a step 62 setting the rounded down data to each bit of the exponent and significand portions of output integer data Fi if sign bit S and designation signal C match; and a step 64 of setting the sign bit of output integer data Fi in accordance with the sign of the input data.

Step 42 further includes: a step 66 of setting each bit of the significand and exponent portions of output integer data Fi correspondingly to the rounded up data when designation signal C and sign bit S do not match; and a step 68 of determining the sign bit of output integer data Fi in accordance with the sign of the input data.

By performing integer representation of the floating point data in accordance with the flow chart shown in FIG. 7, each bit of output integer data Fi can be set in accordance with the case determined by calculation result X which has been described with reference to FIG. 4, so that integer representation of the floating point data can be performed without conversion to the fixed point data at high speed.

Second Embodiment

In a second embodiment, a structure of a floating point calculation unit for performing the floating point calculation method in accordance with the first embodiment will be described.

Figure 10:
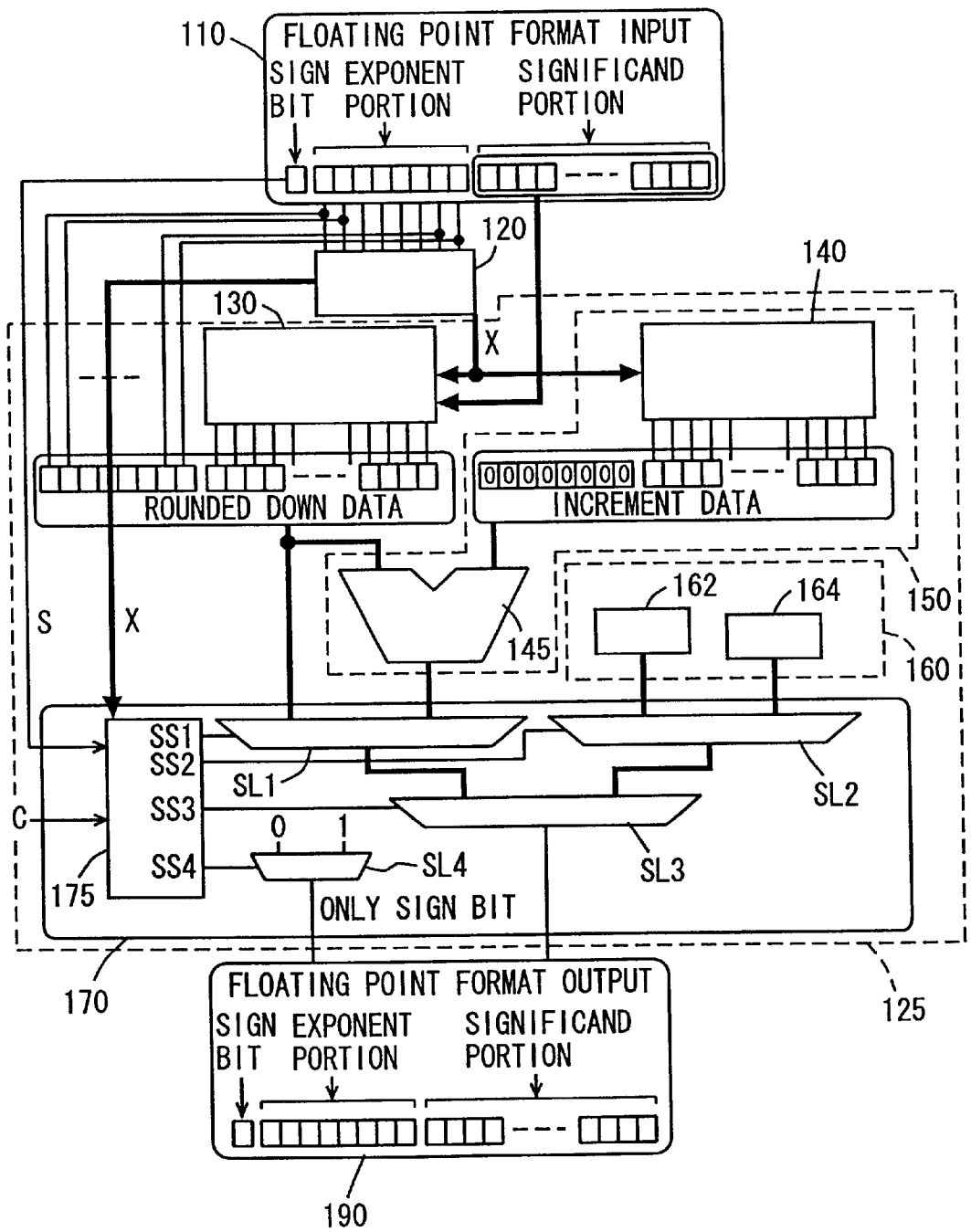
FIG. 10 is a block diagram showing a structure of a floating point calculation unit 100 according to a second embodiment of the present invention.

Referring to FIG. 10, a floating point calculation unit 100 includes: an input circuit 110 receiving input data of the floating point data; an exponent portion data determining circuit 120 performing calculation for 8 bits of an exponent portion of the input data for outputting a calculation result X; an integer representation circuit 125 setting each bit of output integer data Fi in accordance with calculation result X, a sign bit S of the input data and designation signal C; and an output circuit 190 outputting output integer data Fi.

Integer representation circuit 125 includes: a rounded down data generating circuit 130 outputting rounded down data in accordance with the data for the exponent and significand portions of the input data and calculation result X; and a rounding up data generating circuit 150 generating rounded up data corresponding to a value obtained by incrementing the rounded down data by 1.

Rounded up data generating circuit 150 includes: an increment data generating circuit 140 generating increment data in accordance with calculation result X; and an adding circuit 145 adding the rounded down data to the increment data.

Integer representation circuit 125 further includes a fixed value data generating circuit 160 generating fixed data in the floating point format corresponding to 0 and 1 of decimal number representation. Fixed value data generating circuit 160 includes: a fixed value data generating sub circuit 162 generating the fixed value data having bits of the exponent and significand portions corresponding to 0 of the decimal number representation; and a fixed value generating sub circuit 164 generating the fixed value data having bits of the exponent and significand portions corresponding to 1 of the decimal number representation.

Integer representation circuit 125 includes a data selecting circuit 170 setting one of the rounded down data, rounded up data and fixed value data to each bit of the exponent and significand portions of the output integer data and setting the sign bit of the output integer data in accordance with calculation result X, sign bit S of the input data and designation signal C.

Data selecting circuit 170 includes: selectors SL1 to SL3 selecting one of the rounded down data, rounded up data and fixed value data for setting bits of the exponent and significand portions of the output integer data; a selector SL4 setting the sign bit of the output integer data; and a selector control circuit 175 controlling selectors SL1 to SL4 in accordance with calculation result X, sign bit S and designation signal C.

Now, a structure of each circuit shown in FIG. 10 will be described in detail with reference to the flow chart described in the first embodiment.

Figure 11:
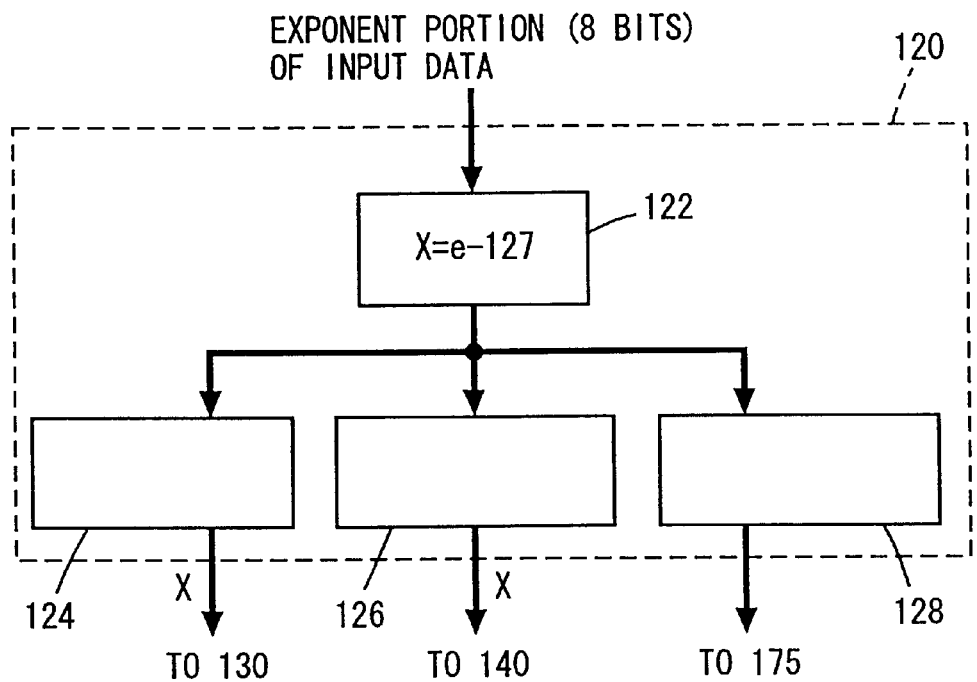
FIG. 11 is a block diagram showing a structure of an exponent portion data determining circuit 120.

FIG. 11 is a block diagram shown in conjunction with a structure of exponent portion data determining circuit 120.

Exponent portion data determining circuit 120 corresponds to step 32 performing calculation for the exponent portion in the flow chart shown in FIG. 7. Exponent portion data determining circuit 120 includes: an exponent portion calculating circuit 122 performing calculation in accordance with equation (3) (X=e−127); and rounded up data generating circuit control logic 124, increment data generating circuit control logic 126 and data selecting circuit control logic 128 for respectively transmitting calculation result X to the rounded up data generating circuit, increment data generating circuit and selector control circuit 175. As the bit number of the exponent portion is predetermined in accordance with the standard also in the case of floating point data, calculation by exponent portion calculating circuit 122 can be performed under the fixed point data format and by a relatively simple circuit.

Figure 12:
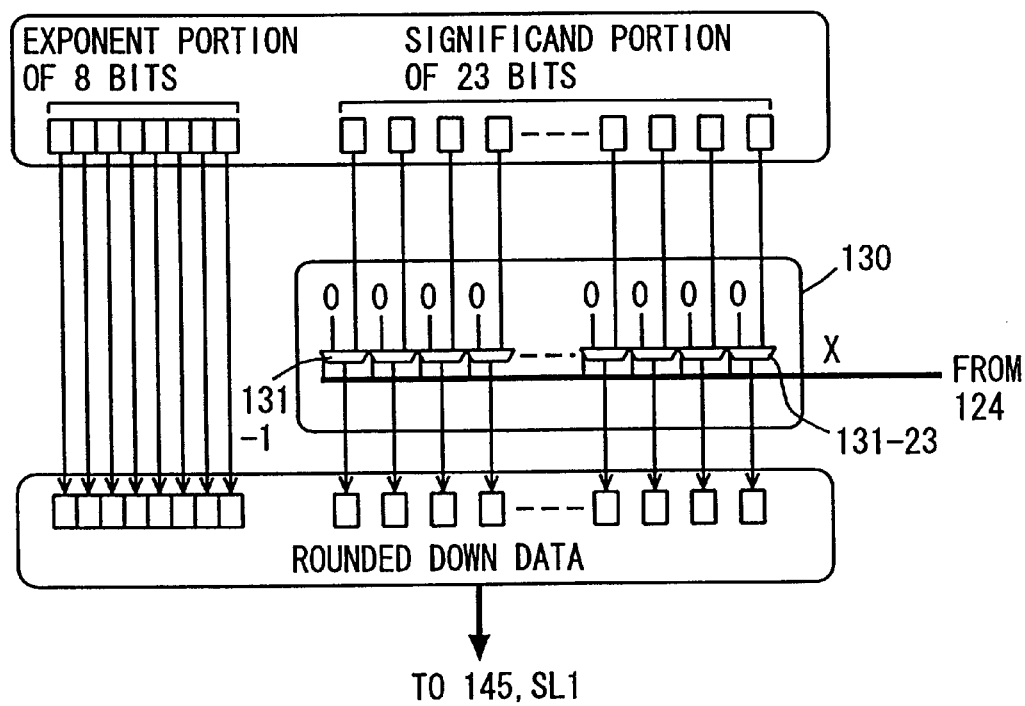
FIG. 12 is a block diagram showing a structure of rounded down data generating circuit 130.

Referring to FIG. 12, rounded down data generating circuit 130 includes multiplexers 131-1 to 131-23 for setting each bit of the significand portion of the rounded down data in accordance with calculation result X. Each multiplexer receives data of "0" and data for bits of the significand portion of the corresponding input data for outputting one of them in accordance with calculation result X. More specifically, as the rounded down data is set as described with reference to FIG. 5, if calculation result X is for example 3, multiplexers 131-1 to 131-3 output bit data corresponding to the significand portion of the input data, whereas multiplexers 131-4 to 131-23 output data of 0 and set each bit of the significand portion of the rounded down data. For the exponent portion of the rounded down data, data for each bit of the exponent portion of the input data is directly set.

Figure 13:
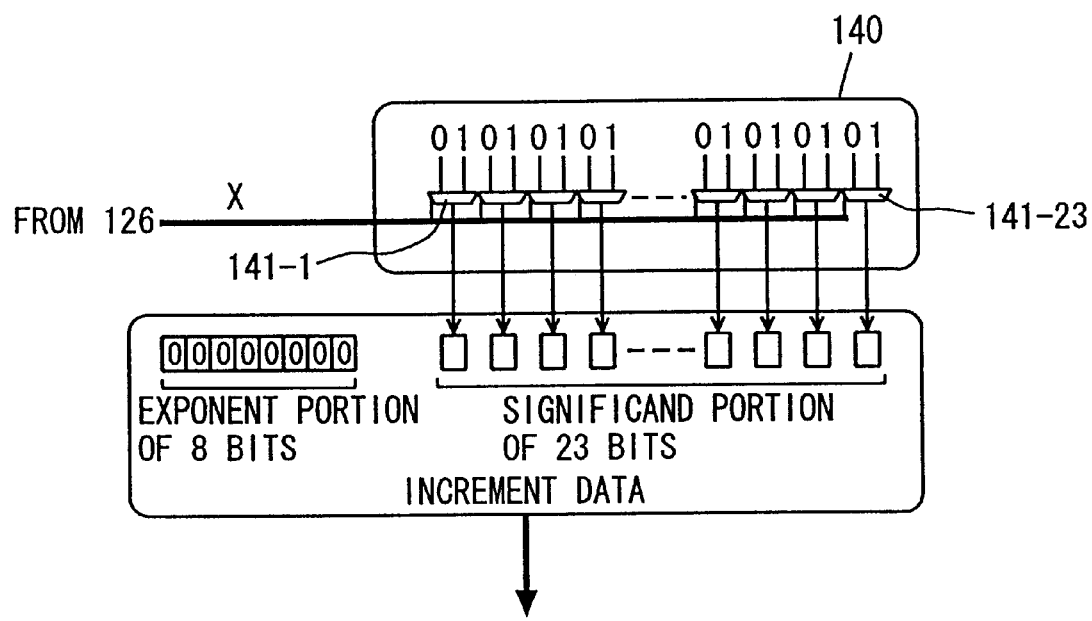
FIG. 13 is a block diagram showing a structure of increment data generating circuit 140.

Referring to FIG. 13, increment data generating circuit 140 includes multiplexers 141-1 to 141-23 for setting each bit of the significand portion of the increment data. Each multiplexer receives data of 0 and 1 for outputting one of them in accordance with calculation result X. More specifically, as the increment data is set as described with reference to FIG. 6, only the multiplexer corresponding to calculation result X outputs 1, and all the other multiplexers output 0. When calculation result X=3, for example, only multiplexer 141-3 outputs data of 1, and all the other multiplexers 141-1, 141-2, 141-4 to 141-23 output data of 0.

Figure 14:
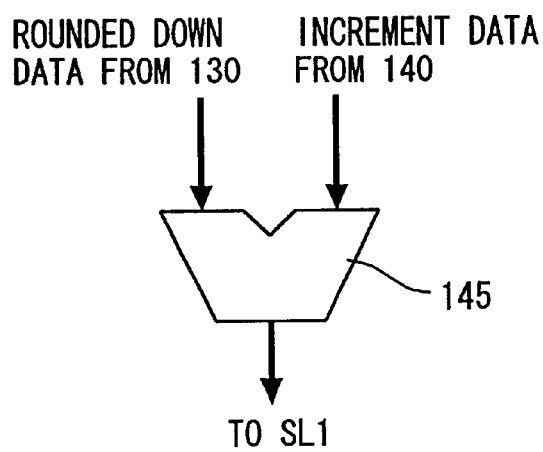
FIG. 14 is a diagram showing input/output data for an adding circuit 145.

Referring to FIG. 14, an adding circuit 145 receives the rounded down data from rounded down data generating circuit 130 and further receives the increment data from increment data generating circuit 140. Adding circuit 145 adds the rounded down data to the increment data for outputting rounded up data. The rounded up data is transmitted to selector SL1 of data selecting circuit 170.

Figure 15:
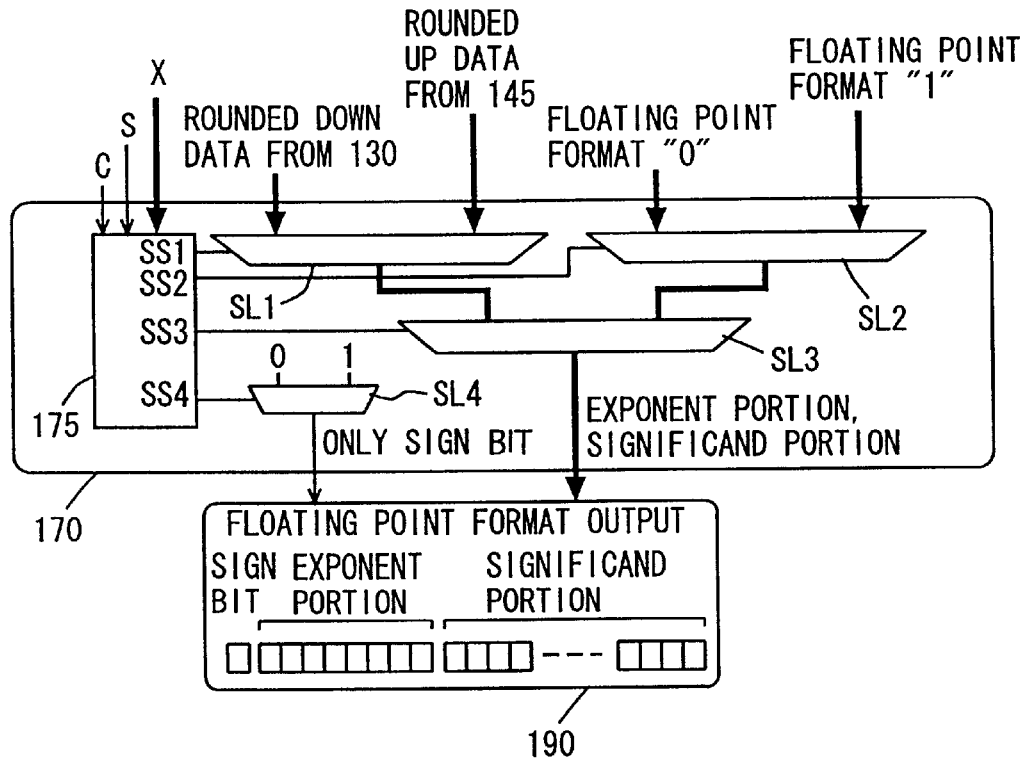
FIG. 15 is a block diagram showing a structure of a data selecting circuit 170.

Referring to FIG. 15, data selecting circuit 170 includes selectors SL1 to SL3 for setting the exponent and significand portions of the output integer data, and a selector SL4 for setting the sign bit of the output integer data. Data selecting circuit 170 further includes selector control circuit 175 generating selector control signals SS1 to SS4 controlling selectors SL1 to SL4 in accordance with calculation result X, sign bit S and designation signal C.

Selector SL1 corresponds to step 60 comparing designation signal C and sign bit S in FIG. 5 and, outputs one of the rounded down data and rounded up data in accordance with selector control signal SS1. Selector control circuit 175 sets selector control signal SS1 such that one of the rounded down data and rounded up data is output from selector SL1 in accordance with a combination of sign bit S and designation signal C which have been described with reference to FIG. 9.

Selector SL2 corresponds to step 72 in FIG. 7, and outputs one of the fixed data of 0 and 1 in the floating point format in accordance with selector control signal SS2. Select control circuit 175 sets selector control signal SS2 such that one of the fixed data corresponding to the combination of sign bit S and designation signal C which have been described in FIG. 8 is output from selector SL2.

Selector SL3 receives outputs from selectors SL1 and SL2, and outputs one of them as the exponent portion and significand portion data of the output integer data in accordance with selector control signal SS3. Selector SL3 corresponds to step 34 for branching into the cases as to evaluation result X in the flow chart shown in FIG. 7. When X<0, selector SL3 sets the output from SL2 as the exponent and significand portions of the output integer data. When $X \geq 0$ selector SL3 sets the output from selector SL1 as the exponent and significand portions of the output integer data.

Selector SL4 sets the sign bit of the output integer data in accordance with selector control signal SS4. Selector control circuit 175 sets selector control signal SS4 such that the sign bits of the input data and output integer data are the same.

It is noted that when X exceeds the bit number of the significand portion, that is, when $X \geq 23$, the input data does not preliminary include data representing fractions below decimal point. Therefore, as described above, the input data may directly be set as be output integer data. When $X \geq 23$, each bit of the rounded down data is set to the same value as that of each bit of the input data, and the increment data is set such that all of the bits are 0. Thus, each bit of the resulting rounded up data and rounded down data are the same as those of the input data. Thus, even when $X \geq 23$, desired output integer data can be obtained by setting the output integer data through a process similar to that in the case of $0 \geq X \geq 23$.

Then, an operation of floating point calculation unit 100 will be described with an exemplary numerical value.

Figure 16:
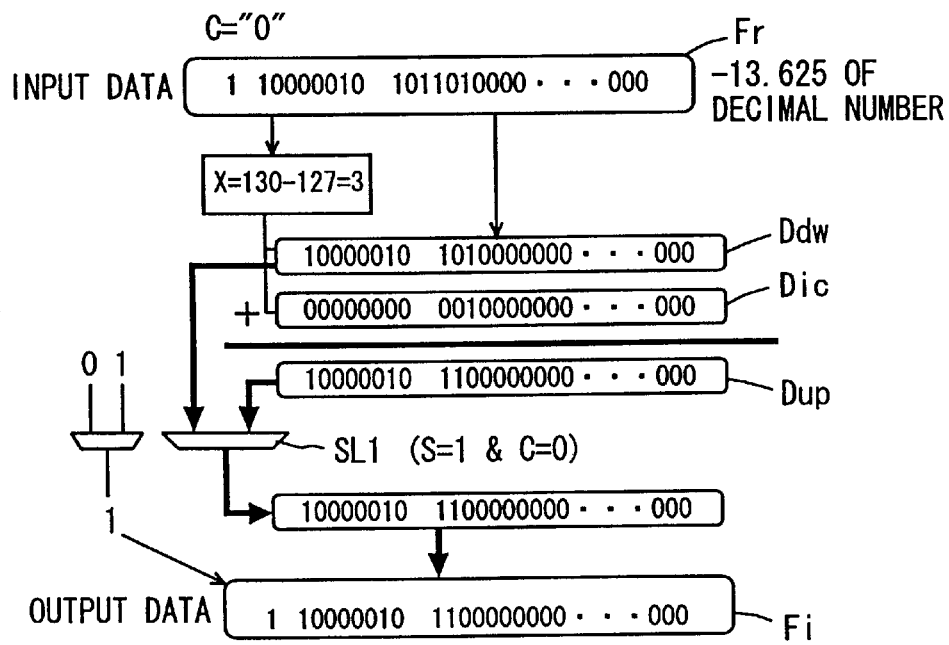
FIG. 16 is a diagram shown in conjunction with an operation when a decimal number of −13.625 is rounded down into an integer in floating point calculation unit 100.

Referring to FIG. 16, integer representation of floating point input data Fr of −13.625 (a decimal number) by rounding down will be considered.

Referring to FIG. 16, input data Fr represents −13.625 (decimal number) in the floating point format. In this case, sign bit S=1, and designation signal C=0 as integer presentation by rounding down has been designated.

First, calculation for the exponent portion is performed by exponent portion data determining circuit 120. The calculation for the exponent portion is performed in accordance with the following equation (4) by subtracting a bias value of 127 from e (a decimal number) shown with 8 bits of the exponent portion of the input data.

$$X=e-127=10000010-01111111=00000011=3 \text{(decimal number)} \quad (4)$$

Thus, 3 is obtained as calculation result X.

Corresponding rounded down data Ddw is generated by rounded data generating circuit 130 in accordance with input data Fr and calculation result X. Rounded down data Ddw is the same as the input data for 8 bits of the exponent portion. For the significand portion, upper 3 bits of rounded down data Ddw are the same as those of input data Fr, and 0 is set to the ninth and following bits.

Increment data Dic is generated by increment data generating circuit 140 in accordance with calculation result X. As X=3, increment data Dic has 1 only at the third bit of the significand portion and 0 at all the other bits.

Adding circuit 145 generates rounded up data Dup obtained by adding rounded down data Ddw to increment data Dic. Selector SL1 receives rounded down data Ddw and rounded up data Dup. In this case, as sign bit S is 1 and designation signal C=0, rounded up data Dup is selected as the output of SL1 as described above with reference to FIG. 9. Further, as $X \geq 0$, rounded up data Dup, which is the output from selector SL1, is directly set to each bit of the significand and exponent portions of output integer data Fi. On the other hand, an output bit of output integer data Fi is set by selector SL4. As sign bit of the input data is 1, the sign bit of the output integer data is also set to 1.

The above described operation provides Fi corresponding to −14 of a decimal number as an output of floating point calculation unit 100.

Thus, floating point calculation unit 100 is provided which performs integer representation of the floating point data only by the circuit for the data having the same number of bits as that of the input data without conversion to the fixed point data in accordance with the floating point calculation method which has been described in the first embodiment. As the circuit for data format conversion is not required and the gate scale and data interconnection width of each circuit can be made relatively small, integer representation of the floating point data can be performed at high speed by a small circuit which is advantageous in terms of layout.

First Modification of Second Embodiment

In the following, a variation in the structure of floating point calculation unit 100 described in the second embodiment will be described.

Figure 17:
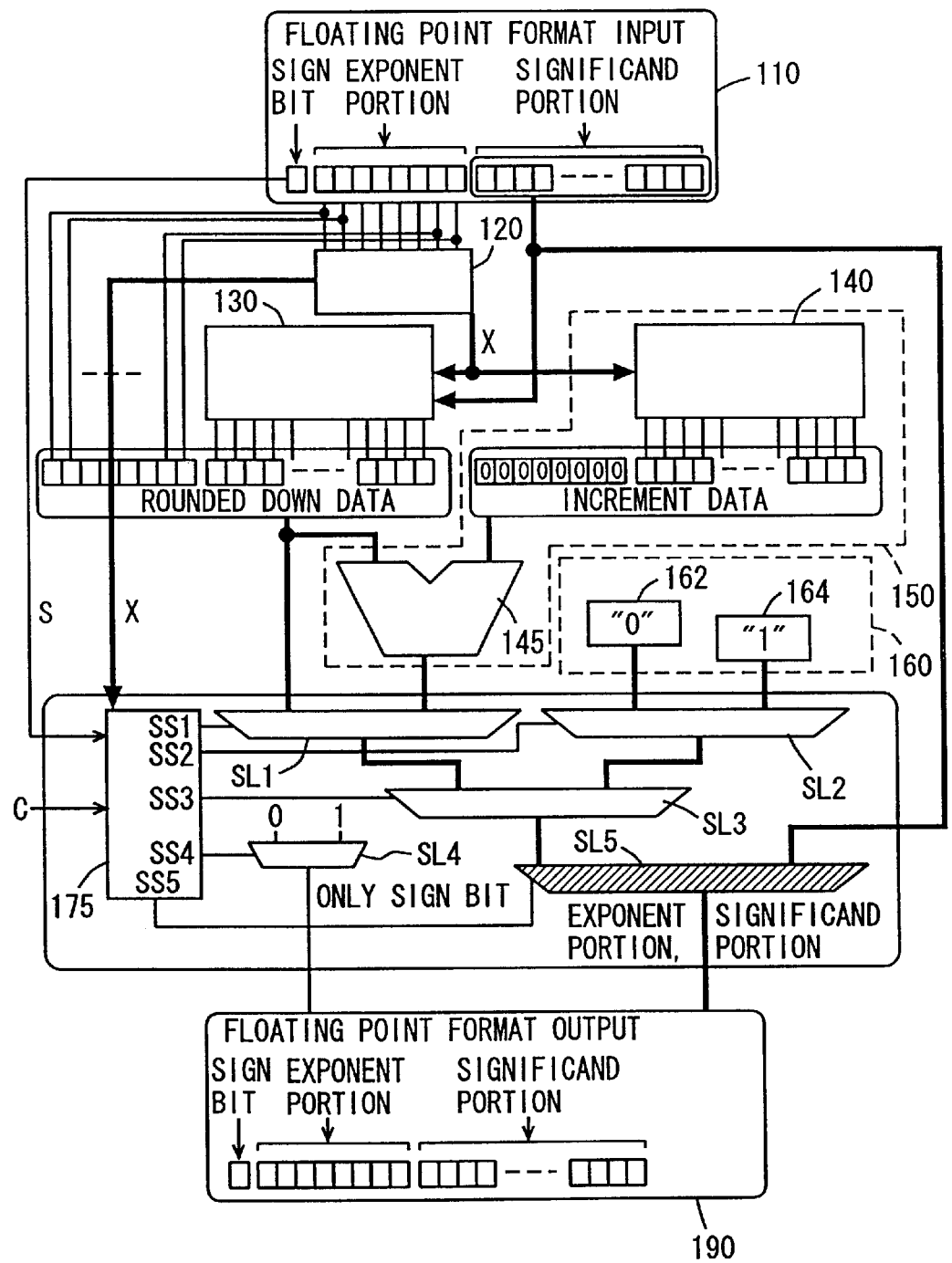
FIG. 17 is a block diagram showing a floating point calculation unit 200 according to a first modification of the second embodiment of the present invention.

Referring to FIG. 17, a floating point calculation unit 200 differs from floating point calculation unit 100 of the second embodiment in that it further includes a selector SL5 controlled by a selector control circuit 175.

Selector SL5 receives an output from selector SL3 and data for exponent and significand portions of input data, and sets one of them to each bit of exponent and significand portions of output integer data in accordance with selector control signal SS5. Other parts of the structure and operation of floating point calculation unit 200 are the same as those of floating point calculation unit 100, and therefore description thereof will not be repeated.

Floating point calculation unit 200 provides a data setting path when calculation result $X \leq 23$ and when each bit of the input data may directly be set as the output integer data. More specifically, selector control signal SS5 is set at a value of calculation result X and, when X≦23, an output from SL5 is made the output from SL3. On the other hand, when X≦23, the output from selector SL5 turns to data of each bit of the exponent and significand portions of the input data applied by input circuit 110.

Such structure allows the output integer data to be set under simple control when X>23, that is, when the input data does not preliminary include data for fractions below decimal point.

Second Modification of Second Embodiment

A floating point calculation unit 210 differs from floating point calculation unit 100 of the second embodiment in that it further includes a fixed value data generating circuit 160 and a selector SL6 between rounded down data generating circuit 130 and adding circuit 145. Floating point calculation unit 210 is not provided with selectors SL2 and SL3, which are provided in floating point calculation unit 100.

Selector SLG operates in accordance with a selector control signal SS6 output from selector control circuit 175. Floating point calculation unit 210 is aimed at reducing an interconnection width and the number of selector circuits by using the same data setting path in cases of X<0 and 0 ≦X≦23 utilizing the fact that all bits of increment data generated by increment data generating circuit 140 are 0 when calculation result X<0.

The other power supply structure and operation are the same as those of floating point calculation unit 200, and therefore description thereof will not be repeated.

When X≧0, selector control circuit 175 sets selector control signal SS6 such that an output from selector SL6 is rounded down data. When X<0, on the other hand, selector control circuit 175 sets selector control signal SS6 such that one of fixed data of 0 and 1 is output in accordance with the combination of sign bit S and designation signal C which have been described with reference to FIG. 8.

Increment data when X≧0 is set as in the case of the second embodiment. Thus, both of the rounded up data and rounded down data may be an input to selector SL1.

When X<0, all bits of the increment data is set to 0 as described with reference to the drawing when X>0, so that outputs from selector SL6 and adding circuit 145 are the same data. Thus, selector SL1 controlled by selector control signal SS1 similar to floating point calculation unit 200 can output prescribed fixed data.

Further, as both of the rounded down data and rounded up data are set to the same value also when X>23, prescribed integer data may be obtained as the output from selector SL1 as described above in the second embodiment. Such structure allows the data path to be shared regardless with a value of calculation result X, so that reduction in the interconnection width and the number of selectors can be achieved.

Third Modification of Second Embodiment

Figure 18:
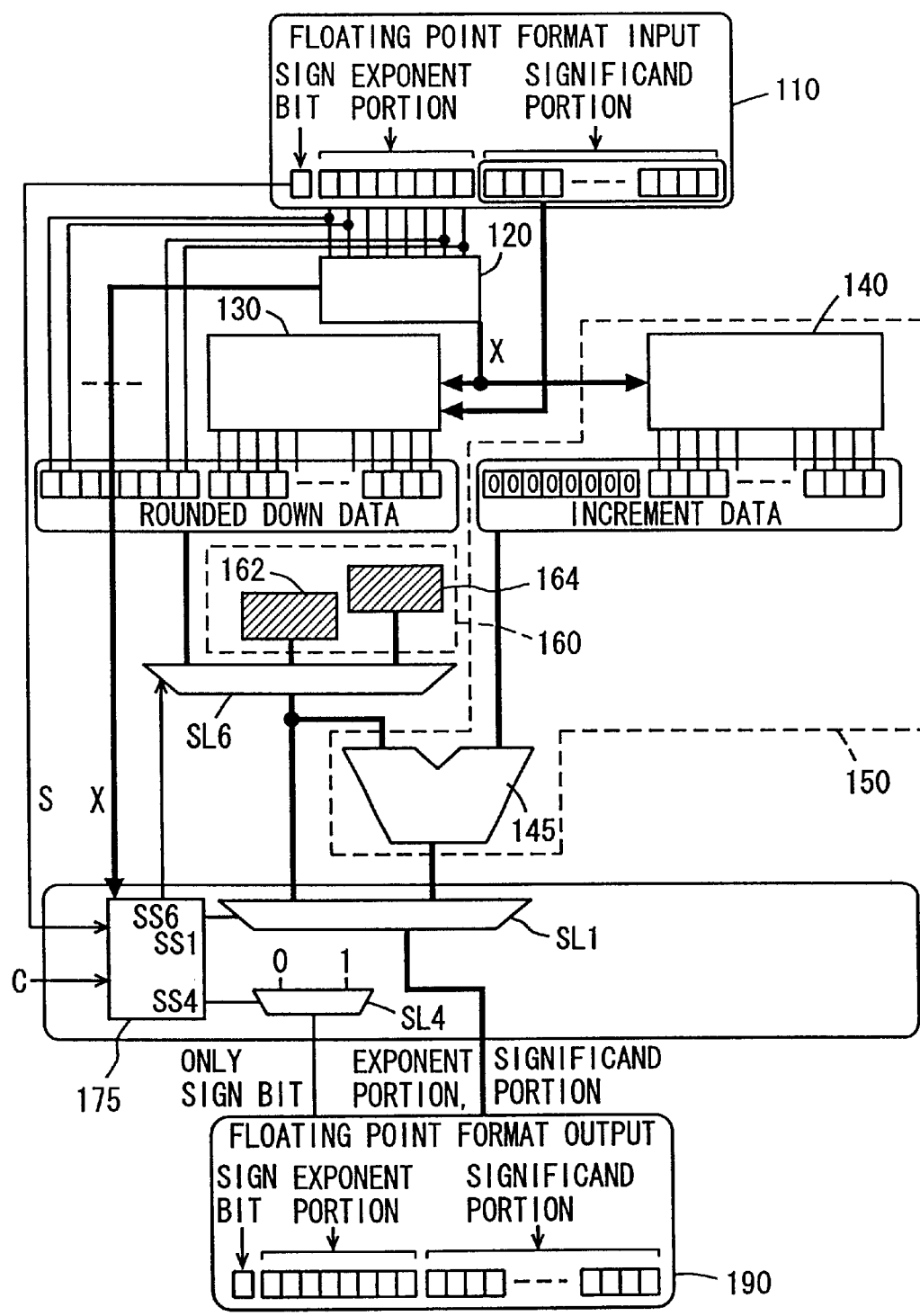
FIG. 18 is a block diagram showing a structure of a floating point calculation unit 210 according to a second modification of the second embodiment of the present invention.
Figure 19:
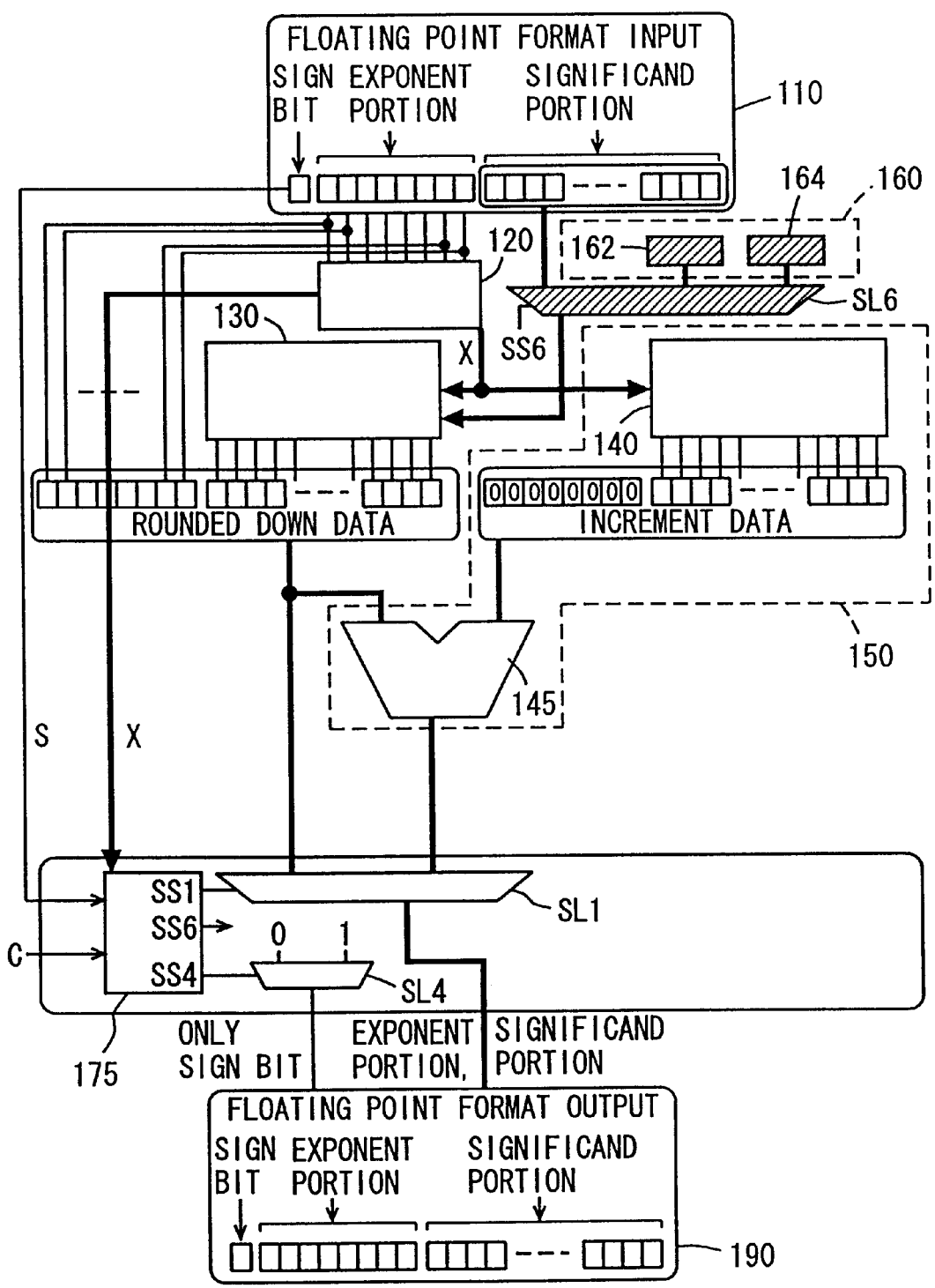
FIG. 19 is a block diagram showing a structure of a floating point calculation unit 220 according to a third modification of the second embodiment of the present invention.

Referring to FIG. 19, a floating point calculation unit 220 differs from floating point calculation unit 210 shown in FIG. 18 in that fixed value data generating circuit 160 and selector SL6 are provided between an input circuit 110 and a rounded down data generating circuit 130 rather than between rounded down data generating circuit 130 and adding circuit 145. The other parts of the structure and operation are the same as those in the case of floating point calculation unit 210, and therefore description thereof will not be repeated.

Such structure allows data of all bits of the increment data to be set to 0 when X<0 and when X>23, so that an output path of data can be shared regardless of a value of calculation result X as in the case of floating point calculation unit 210. Thus, reduction in the interconnection width and the number of selector circuits can be achieved.

Fourth Modification of Second Embodiment

Figure 20:
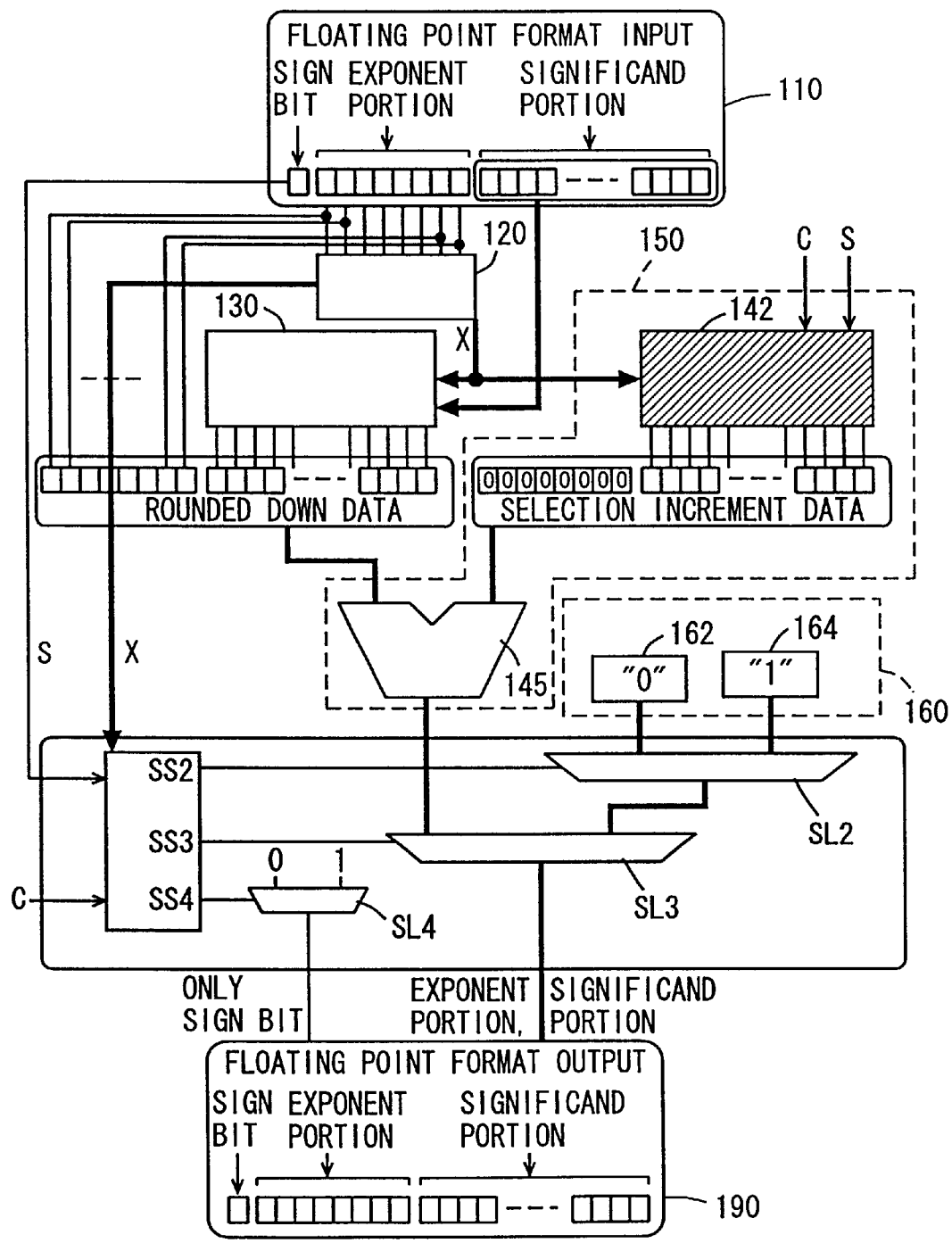
FIG. 20 is a block diagram showing a structure of a floating point calculation unit 230 according to a fourth modification of the second embodiment of the present invention.

Referring to FIG. 20, a floating point calculation unit 230 differs from floating point calculation unit 100 of the second embodiment in that it is provided with an increment data generating circuit 142 in place of increment data generating circuit 140, selector SL1 is eliminated and data of adding circuit 145 is directly input to selector SL3.

In addition to the function of increment data generating circuit 140 of the second embodiment, increment data generating circuit 142 has a function of selector SL1 selecting which one of the rounded up data and rounded down data is to be used. In other words, increment data generating circuit 142 generates selection increment data in accordance with a combination of designation signal C and sign bit S.

Referring to FIG. 21, when sign bit S and designation signal C match, that is, when the rounded down data has been employed in the case shown in FIG. 9, all bits of the selection increment data are set to 0. On the other hand, when sign bit S and designation signal C do not match, that is, when the rounded up data has been selected in the case shown in FIG. 9, increment data is set to the selection increment data as in the conventional case.

Adding circuit 145 adds the rounded down data to the selection increment data for outputting it to selector SL3. Thus, output data of adding circuit 145 which sets the selection increment data in accordance with the combination of sign data S and designation signal C by increment data generating circuit 142 is the same as input data of selector SL3 of floating point calculation unit 200. Such structure allows reduction in the number of selectors, so that an effect similar to that in the case of floating point calculation unit 200 can be produced with a simpler circuit structure.

Fifth Modification of Second Embodiment

Figure 22:
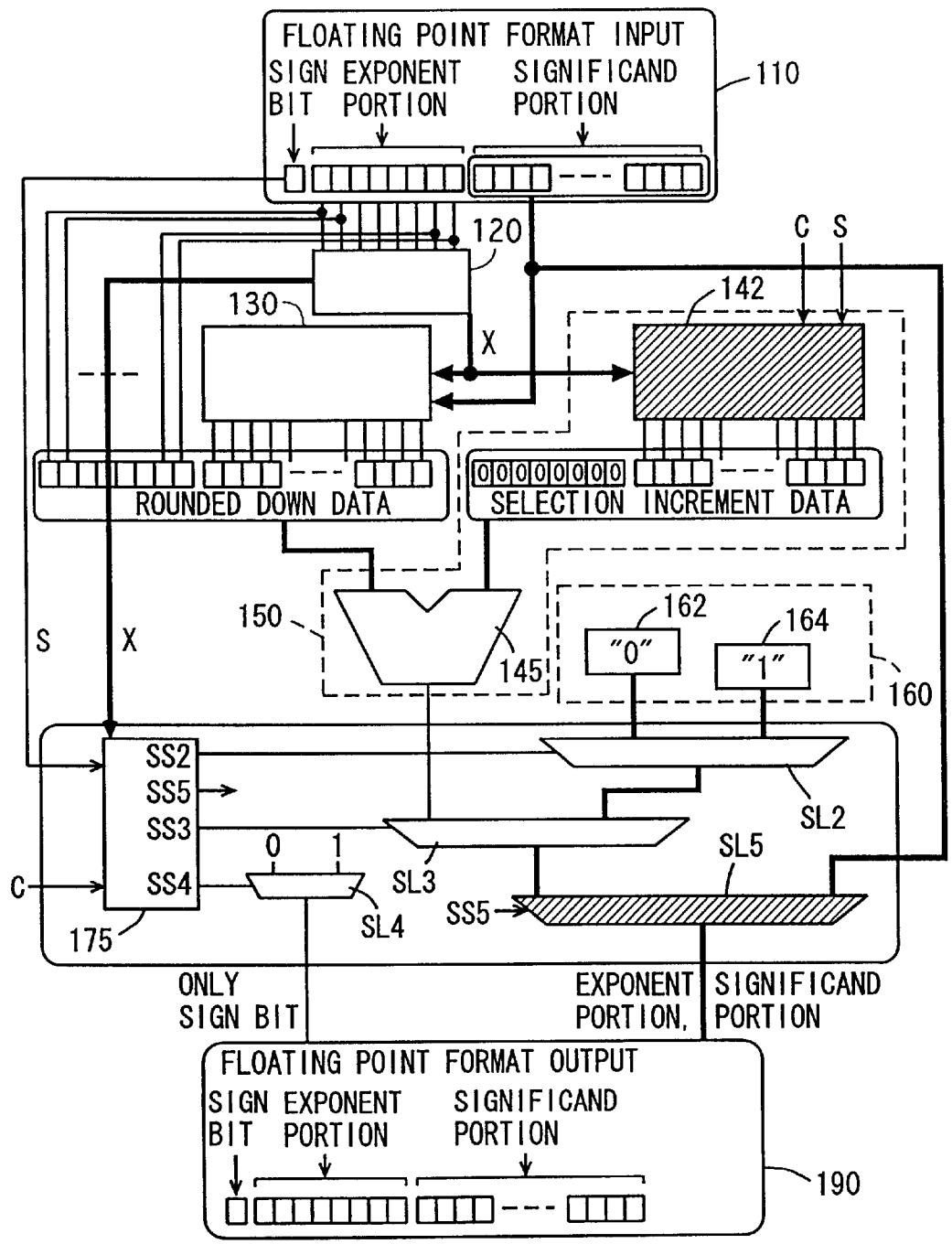
FIG. 22 is a block diagram showing a structure of a floating point calculation unit 240 according to a fifth modification of the second embodiment of the present invention.

Referring to FIG. 22, a floating point calculation unit 240 differs from floating point calculation unit 230 in that it further includes selector SL5 having the output from selector SL3 and the input data from the input circuit as inputs.

Floating point calculation unit 240 corresponds to a combination of floating point calculation unit 230 of the fourth modification of the second embodiment and floating point calculation unit 200 of the first modification of the second embodiment. Floating point calculation unit 240 has a simplified structure of the control logic obtained by more simply setting the output integer data when X>23.

Sixth Modification of Second Embodiment

Figure 23:
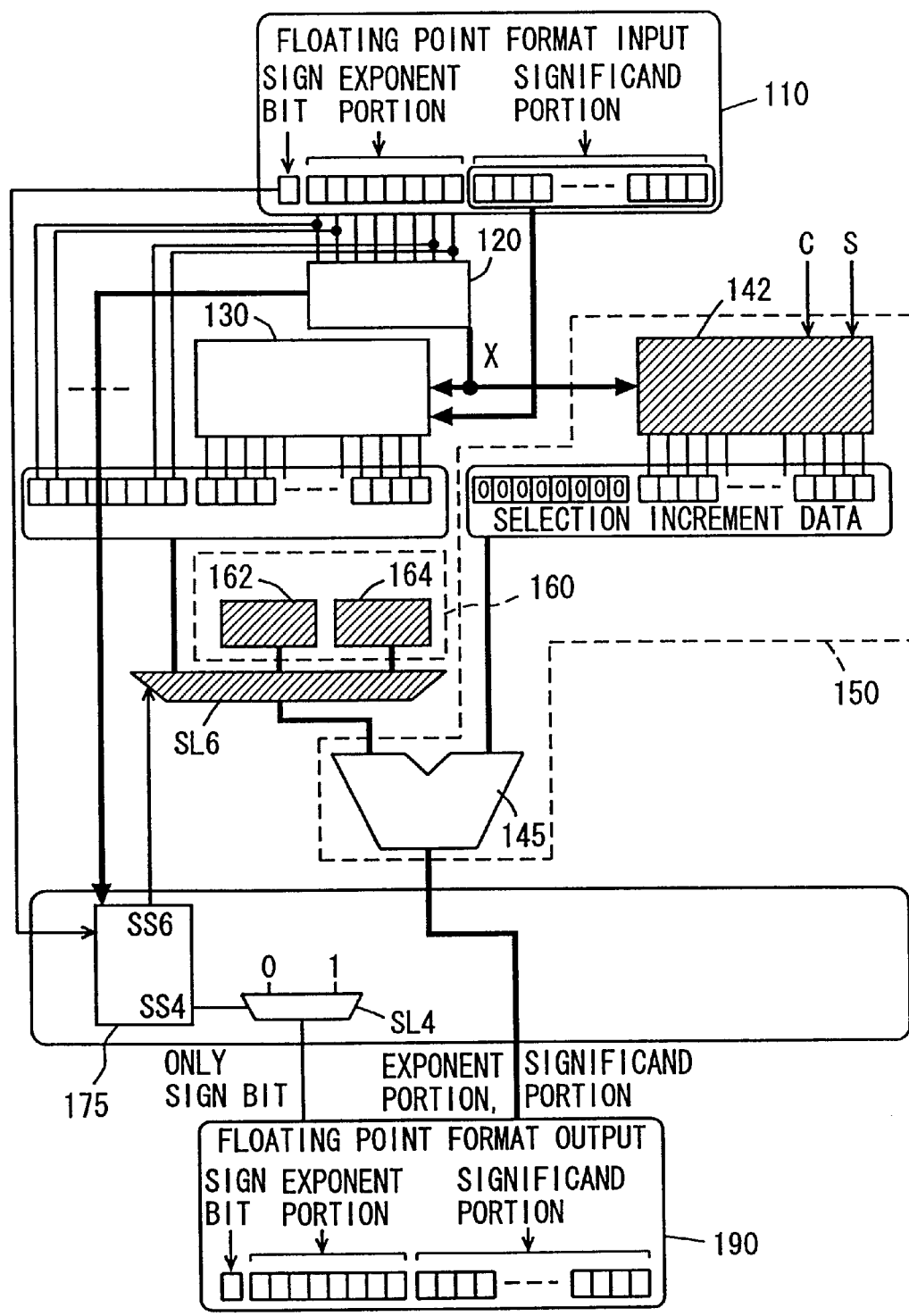
FIG. 23 is a block diagram showing a structure of a floating point calculation unit 250 according to a sixth modification of the second embodiment of the present invention.

Referring to FIG. 23, a floating point calculation unit 250 differs from floating point calculation unit 230 shown in FIG. 20 in that fixed value data generating circuit 160 and selector SL6 are provided between rounded down data generating circuit 130 and adding circuit 145 and in that the output from adding circuit 145 is directly set to the exponent and significand portions of the output integer data without passing through the selector.

Floating point calculation unit 250 corresponds to a combination of structures of floating point calculation unit 230 and floating point calculation unit 210 of the second modification of the second embodiment. Floating point calculation unit 250 allows further reduction in the number of selectors and the interconnection width in addition to the effect produced by floating point calculation unit 230.

Seventh Modification of Second Embodiment

Figure 24:
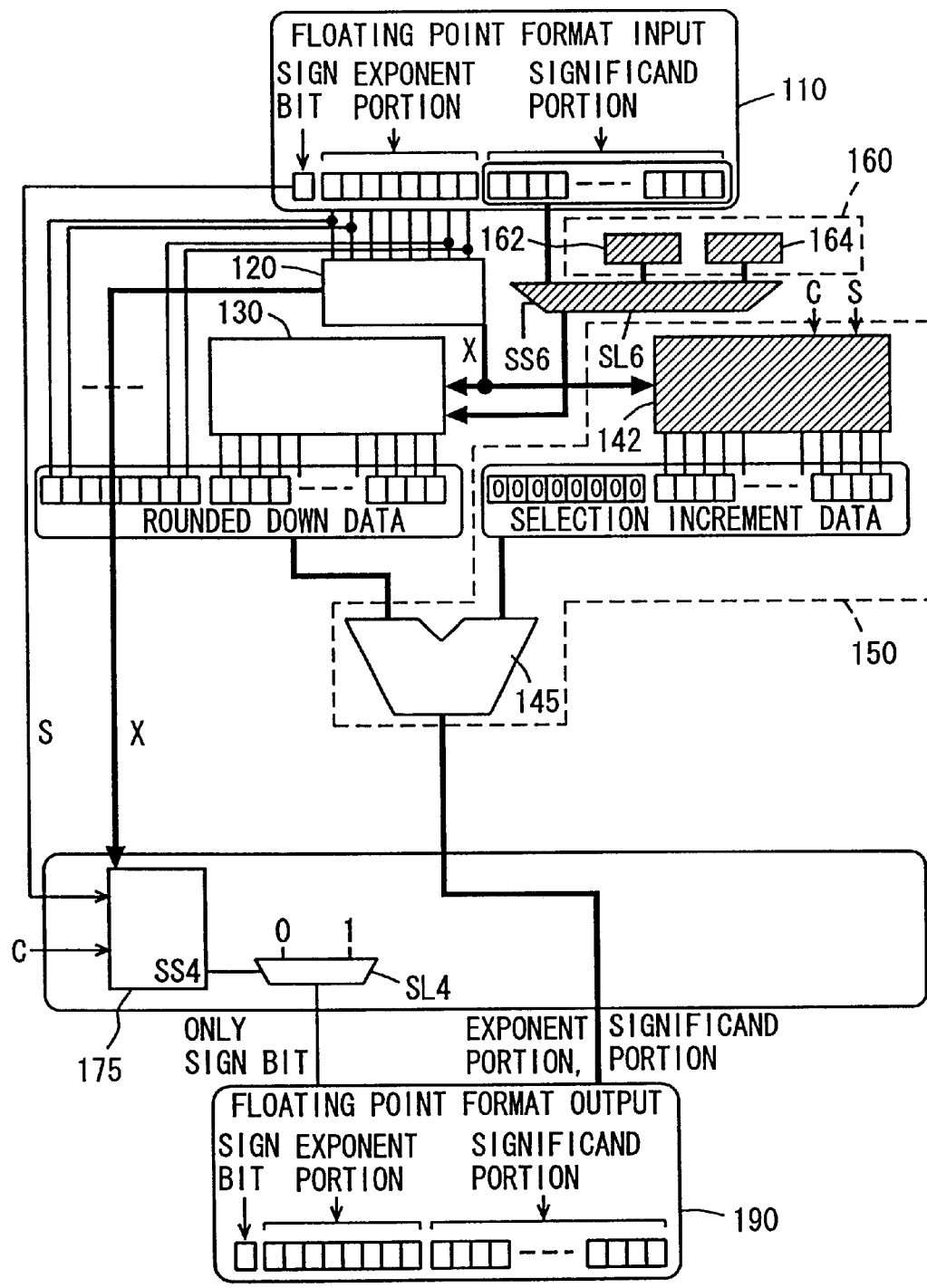
FIG. 24 is a block diagram showing a structure of a floating point calculation unit 260 according to a seventh modification of the second embodiment of the present invention.

Referring to FIG. 24, floating point calculation unit 260 differs from floating point calculation unit 250 in FIG. 23 in that fixed value data generating circuit 160 and selector SLG are provided between an input circuit 110 and a rounded down data generating circuit 130 rather than between rounded down data generating circuit 130 and adding circuit 145. The other parts of the structure and operation are the same as those of floating point calculation unit 250 shown in FIG. 23, and therefore description thereof will not be repeated.

Floating point calculation unit 260 corresponds to a combination of the structures of floating point calculation unit 230 and floating point calculation unit 220 of the third modification of the second embodiment. Such structure also produces an effect similar to that in the case of floating point calculation unit 250.

Eighth Modification of Second Embodiment

Figure 25:
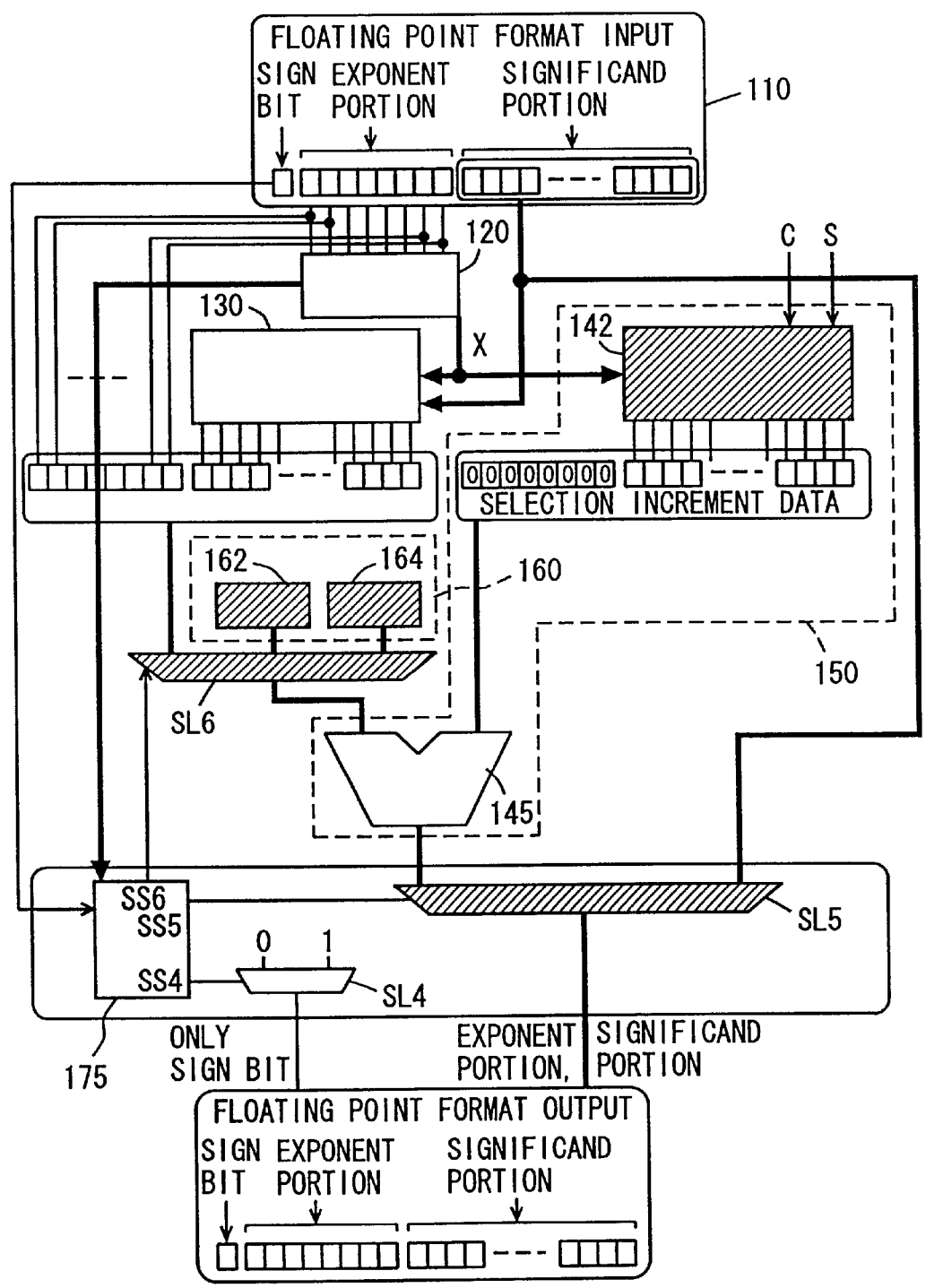
FIG. 25 is a block diagram showing a structure of a floating point calculation unit 270 according to an eighth modification of the second embodiment of the present invention.

Referring to FIG. 25, a floating point calculation unit 270 differs from floating point calculation unit 250 of the sixth modification of the second embodiment in that it further includes selector SL5 controlled by selector control circuit 175. Selector SL5 receives data for exponent and significand portions of output and input data of adding circuit 145 and sets one of them as data of each bit of the exponent and significand portions of the output integer data. The other parts of the structure and operation of floating point calculation unit 270 are the same as those of floating point calculation unit 250, and therefore description thereof will not be repeated.

Floating point calculation unit 270 corresponds to a combination of structures of floating point calculation unit 250 and floating point calculation unit 200 of the first modification of the second embodiment. Floating point calculation unit 270 allows setting of the output integer data to be performed under simpler control when the input data does not preliminary include data for fractions below decimal point.

Ninth Modification of Second Embodiment

Figure 26:
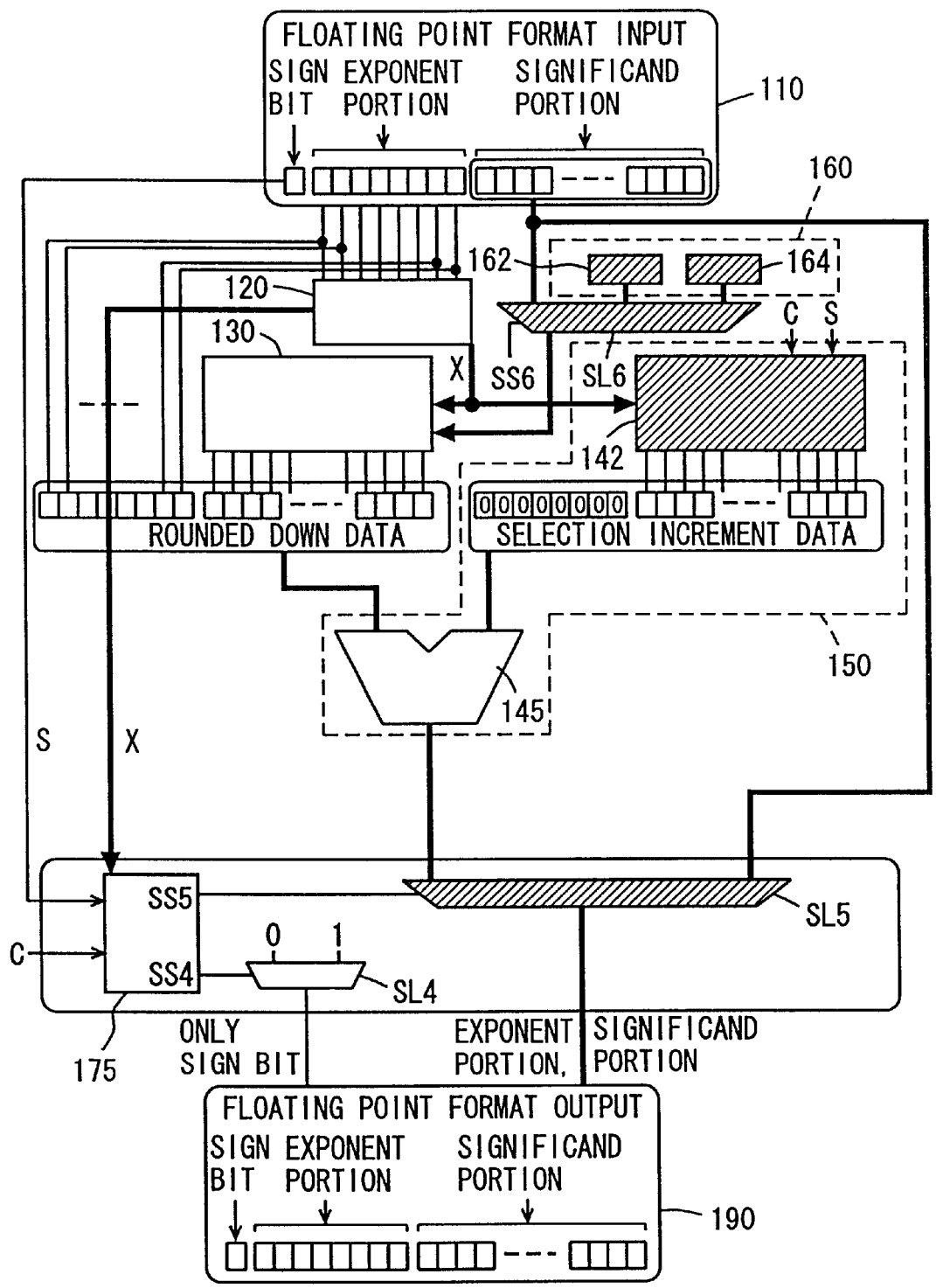
FIG. 26 is a block diagram showing a structure of a floating point calculation unit 280 according to a ninth modification of the second embodiment of the present invention.

Referring to FIG. 26, a floating point calculation unit 280 differs from floating point calculation 260 of the seventh modification of the second embodiment in that it further includes selector SL5 controlled by selector control circuit 175. Selector SL5 receives data for exponent and significand portions of output and input data of adding circuit 145 and sets one of them as data of each bit of exponent and significand portions of output integer data in accordance with selector control signal SS5. The other parts of the structure and operation of floating point calculation unit 280 are the same as those of floating point calculation unit 260, and therefore description thereof will not be repeated.

Floating point calculation unit 280 corresponds to a combination of structures of floating point calculation unit 260 and floating point calculation unit 200 of the first modification of the second embodiment. Such structure also produces an effect similar to that in the case of floating point calculation unit 270.

Third Embodiment

In a third embodiment, a structure of a semiconductor integrated circuit device provided with the floating point calculation unit described in the second embodiment will be described.

Figure 27:
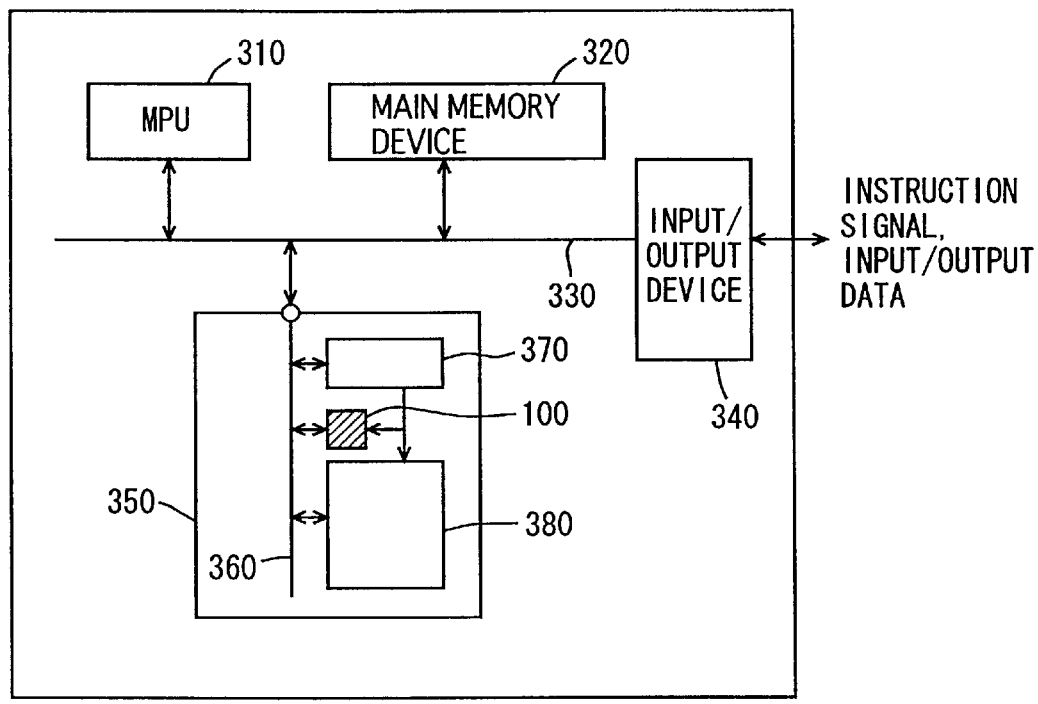
FIG. 27 is a schematic block diagram showing an overall structure of a semiconductor integrated circuit device 300 according to a third embodiment of the present invention.

Referring to FIG. 27, a semiconductor integrated circuit device of the third embodiment includes: an input/output device 340 for externally inputting/outputting an designation signal or input/output data; a system bus 330 for transmitting data and a control signal in the semiconductor integrated circuit device; an MPU 310, a main memory device 320 storing data, and an LSI (Large Scale Integration) with built-in memory 350 connected to system bus 330.

MPU 310 performs arithmetic calculation and logic calculation to decode and execute a process corresponding to an externally applied instruction signal, generates an internal control signal and controls an operation of an overall semiconductor integrated circuit device. Main memory device 320 stores data as necessary in accordance with an designation of the MPU. LSI with built-in memory 350 is a dedicated LSI provided for performing an operation in which integer representation of floating point data is frequently performed at high speed.

LSI with built-in memory 350 includes: a logic circuit portion 370 controlling an operation of the LSI; a data bus 360 capable of transmitting data to system bus 330; and a memory circuit 380 for storing data. LSI 350 operates in accordance with a control signal generated by the MPU.

LSI with built-in memory 350 further includes floating point calculation unit 100 of the second embodiment. Provided with floating point calculation unit 100, LSI 350 performs integer representation of the floating point data as necessary at high speed and stores the result in memory circuit 380 or output the result to system bus 330.

Thus, LSI 350 can perform the operation in which integer representation of the floating point data must frequently be performed at high speed, such as an operation for image processing or the like. Floating point calculation units 200 to 270 which have been described in the first to seventh modifications of the second embodiment may also be used as the floating point calculation unit. Although floating point calculation unit 100 is provided independently of logic circuit portion 370 in FIG. 15, a similar effect is produced if LSI 350 is operated by the logic circuit portion internally provided with floating point calculation unit 100.

Modification of Third Embodiment

A semiconductor integrated circuit device 400 is aimed at performing an operation for image processing in which integer representation of data must frequently be performed at high speed in the image data processing.

Figure 28:
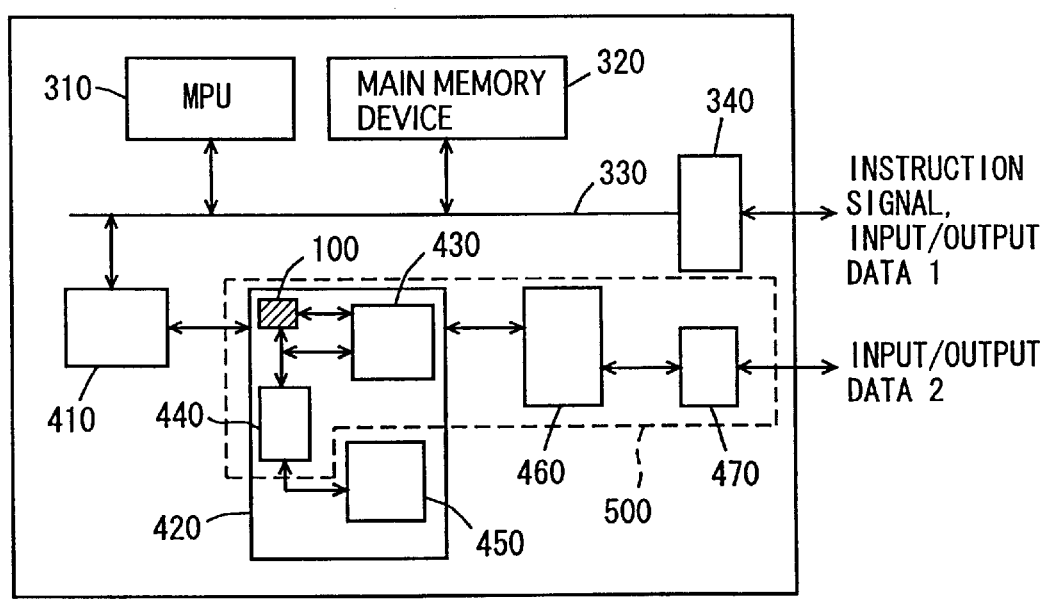
FIG. 28 is a schematic block diagram showing an overall structure of a semiconductor integrated circuit device 400 according to a modification of the third embodiment of the present invention.

Referring to FIG. 28, semiconductor integrated circuit device 400 includes: an MPU 310; a main memory device 320; a system bus 330; an input/output device 340; a dedicated LSI 410 performing at high speed calculation for image processing such as a geometry engine or the like; an LSI 420 for image processing related to image processing data; a frame memory 460 storing the image processing data; and an input/output device 470 independently inputting/outputting the image processing data. Dedicated LSI 410 is an integrated circuit having a specialized hardware capable of processing at high speed calculating geometry conversion or the like which is used for image processing.

LSI for image processing 420 includes a logic circuit portion 440, memory circuits 430, 450 and floating point calculation unit 100. A plurality of memory circuits are provided in LSI for image processing 420, and the image processing data which must be input/output at high speed is processed only by memory circuit 430. Floating point calculation unit 100 is provided correspondingly to memory circuit 430, and perform at high speed integer representation of the floating point data as necessary in accordance with the designation of the logic circuit portion. The integer-represented floating point data is stored in memory circuit 430. The image processing data stored in memory circuit 430 is externally transmitted/received through frame memory 460 and input/output device 470 independently of other input/output data.

Such structure allows integer representation of the floating point data to be performed at high speed by a group of circuits 500 surrounded by a dotted line including floating point calculation unit 100. Thus, the operation such as image processing related to frequent integer representation can be performed at high speed. Floating point calculation units 200 to 270 which have been described in the first to seventh modifications of the second embodiment may be used as the floating point calculation unit also in this case. Further, a similar effect is produced if LSI 420 is operated by logic circuit portion 440 internally provided with floating point calculation unit 100.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A floating point calculation method for calculating binary floating point data, which is given as an input data having a sign bit, an exponent portion of M bits (M: a natural number) and a significand portion of N bits (N: a natural number), to obtain binary integer data in floating point notation, comprising the steps of:

obtaining a calculation result X (X: an integer) by subtracting a prescribed bias value from a decimal number value corresponding to said exponent portion of said binary floating point data; and setting each bit of said binary integer data by rounding said binary floating point data to a whole number in floating point notation in accordance with a combination of said calculation result X, a sign of said binary floating point data and a calculation mode selectively designated from rounding up and rounding down.

2. The floating point calculation method according to claim 1, wherein said step of setting each bit of said binary integer data includes the steps of:

setting each bit of said binary integer data to a same value as each bit of said input data when said calculation result X exceeds N;

calculating said binary floating point data to obtain said binary integer data in floating point notation corresponding to either one of −1, 0 and 1 in decimal notation in accordance with a combination of said sign of said binary integer data and said calculation mode when said calculation result X is smaller than 0; and calculating said binary floating point data to obtain said binary integer data in floating point notation corresponding to either one of rounded down data and rounded up data in accordance with a combination of said sign of said binary integer data and said calculation mode when said calculation result X is at least 0 and at most N, wherein said rounded down data has a first bit to a (M+X)th bit equal to those of said binary floating point data, and has 0 at each of (M+X+1)th bit and following bits, and said rounded up data is obtained by adding said rounded down data to increment data of (M+X) bits having 1 at (M+X)th bit when X is more than 0 and 0 at each of the other bits.

3. The floating point calculation method according to claim 2, wherein said step of setting each bit of said binary integer data when said calculation result X is smaller than 0 includes the steps of:

generating first fixed value data of (M+N) bits having a bit string of an exponent portion and a significand portion of floating point data corresponding to 0 of the decimal number value and second fixed value data of (M+N) bits having a bit string of an exponent portion and a significand portion of floating point data corresponding to 1 of the decimal number value;

setting each bit of said exponent portion and significand portion of said binary integer data to each bit of said first fixed value data when rounding up is designated for negative input data and when rounding down is designated for positive input data;

setting each bit of said exponent portion and significand portion of said binary integer data to each bit of said second fixed value data when rounding up is designated for said positive input data and when rounding down is designated for said negative input data; and setting a sign bit of said binary integer data to a same value as that of a sign bit of said input data.

4. The floating point calculation method according to claim 2, wherein said step of setting each bit of said binary integer data when said calculation result X is at least 0 and at most N includes the steps of:

setting a value of each bit of said rounded down data of (M+N) bits to each bit of said exponent portion and significand portion of said binary integer data when rounding up is designated for negative input data and when rounding down designated for positive input data;

setting a value of each bit of said rounded up data of (M+N) bits to each bit of said exponent portion and significand portion of said output integer data when rounding up is designated for said positive input data and when rounding down is designated for said negative input data; and setting a sign bit of said binary integer data to a same value as that of said sign bit of said input data.

5. A floating point calculation unit for converting binary floating point data having a sign bit, an exponent portion of M bits (M: a natural number) and a significand portion of N bits (N: a natural number) into binary integer data in floating point notation, comprising:

an input circuit receiving said binary floating point data as input data;

an exponent portion calculating circuit outputting a calculation result X (X: an integer) obtained by subtracting a prescribed bias value from a decimal number value corresponding to said exponent portion of said input data;

an integer-represented data setting circuit receiving said input data for setting each bit of binary integer data in accordance with a combination of said calculation result X, a sign of said input data and an integer representation designation signal designating which one of rounding up and rounding down is to be performed on said input data; and an output circuit outputting said binary integer data.

6. The floating point calculation unit according to claim 5, wherein said integer-represented data setting circuit includes:
- a circuit for rounding down fractions below decimal point for generating rounded up data of (M+N) bits having a bit string of an exponent portion and significand portion of said floating point data corresponding to an integer value obtained by rounding down fractions below decimal point of a decimal number value represented by an exponent portion and significand portion of said input data;
- a circuit for rounding up fractions below decimal point receiving said rounded down data for generating rounded up data of (M+N) bits having a bit string of an exponent portion and significand portion of said floating point data corresponding to an integer value obtained by incrementing a decimal number value represented by said rounded down data by 1;
- a fixed value output circuit for generating first fixed value data of (M+N) bits having a bit string of an exponent portion and significand portion of said floating point data corresponding to 0 of a decimal number value and second fixed value data having (M+N) bits having a bit string of an exponent portion and significand portion of floating point data corresponding to 1 of said decimal number value; and
- an output data selecting circuit selecting one of said rounded down data, rounded up data, first fixed value data and second fixed value data in accordance with a combination of said calculation result X, a sign of said input data and said integer representation signal for transmitting it to said output circuit as a value of each bit of an exponent portion and significand portion of said binary integer data and setting said sign bit of said binary integer data for transmitting it output circuit.

7. The floating point calculation unit according to claim 6, wherein said circuit for rounding down fractions below decimal point receives (M+N)-bit data corresponding to said exponent portion and significand portion of said input data for setting a same value as that of a corresponding bit of said (M+N)-bit data to a first bit to a (M+X)th bit of said rounded down data and setting 0 to a (M+X+1)th bit and following bits, and wherein said circuit for rounding up fractions below decimal point includes
- an increment data generating circuit generating increment data of (M+N) bits having 1 at an (M+X)th bit when X is larger than 0 and 0 at all the other bits, and
- an adding circuit adding said rounded down data to said increment data for outputting said rounded up data.

8. The floating point calculation unit according to claim 6, wherein said output data selecting circuit includes: a first selector circuit receiving said rounded up data and said rounded down data for outputting one of them in accordance with a combination of said sign of said input data and said integer representation signal;
- a second selector circuit receiving said first fixed value data and said second fixed value data for outputting one of them in accordance with said combination of said sign of said input data and said integer representation signal; and
- a third selector circuit receiving output data from said first selector circuit and output data from said second selector circuit for transmitting one of them to said output circuit for setting each bit of said exponent portion and significand portion of said binary integer data,
- said third selector circuit outputting said output data from said first selector circuit when said calculation result X is at least 0 and outputting said output data from said second selector circuit when said calculation result X is smaller than 0, and
- said output data selecting circuit further including a fourth selector circuit for transmitting a same value as that of said sign bit of said input data as a sign bit of said binary integer data to said output circuit.

9. The floating point calculation unit according to claim 8, wherein said output data selecting circuit further includes a fifth selector circuit, provided between said third selector circuit and said output circuit, and receiving an output data from said third selector circuit and a sub data having a bit string of an exponent portion and significand portion of said input data for outputting a value of each bit of said sub data as value of each bit of said exponent portion and significand portion of said output integer data when said calculation result X is at least N and outputting said output data from said third selector circuit as said value of each bit of said exponent portion and significand portion of said output integer data when said calculation result X is smaller than N.

10. The floating point calculation unit according to claim 6, wherein said circuit for rounding down fractions below decimal point receives (M+N)-bit data corresponding to said exponent portion and significand portion of said input data and said calculation result X for setting a same value as that of a corresponding bit of said (M+N)-bit data to a first bit to (M+X)th bit of said rounded down data and setting 0 to an (M+X+1)th bit and following bits of said rounded down data,
- said output data selecting circuit includes a first selector circuit receiving said first fixed value data, said second fixed value data and said rounded down data for outputting said rounded down data when said calculation result X is at least 0 and outputting one of said first fixed value and second fixed value data in accordance with a combination of said sign of input data and said integer representation designation signal when said calculation result X is smaller than 0, said circuit for rounding up fractions below decimal point includes
- an increment data generating circuit generating increment data of (M+N) bits having 1 only at an (M+X) th bit when X is more than 0 and 0 at all the other bits, and
- an adding circuit adding output data from said first selector circuit to said increment data for outputting said rounded up data, and said output data selecting circuit further includes
    - a second selector circuit receiving said output data from said first selector circuit and output data from said adding circuit for transmitting one of them to said output circuit to set it to each bit of said exponent portion and significand portion of said output integer data in accordance with a combination of said sign of said input data and said integer representation designation signal, and
    - a sign selector circuit transmitting a same value as that of said sign bit of said input data to said output circuit as a sign bit of said output integer data.

11. The floating point calculation unit according to claim 6, wherein said output data selecting circuit includes a first selector circuit provided between said input circuit and said rounded down data generating circuit,
- said first selector circuit receives said first fixed value data, said second fixed value data and (M+N)-bit data corresponding to said exponent portion and significand portion of said input data for outputting said (M+N) bit data when said calculation result X is at least 0 and outputting one of said first fixed value data and said second fixed value data in accordance with a combination of said sign of said input data and said integer representation signal when said calculation result X is less than 0, said circuit for rounding down fractions below decimal point receives output data from said first selector circuit and said calculation result for setting a same value as that of a corresponding bit of said output data of said first selector circuit to a first bit to a (M+X)th bit of said rounded down data and setting 0 to a (M+X+1)th bit and following bits of said rounded down data, said circuit for rounding up fractions below decimal point includes an increment data generating circuit generating increment data of (M+N) bits having 1 only at an (M+X) th bit when X is larger than 0 and 0 at all the other bits, and an adding circuit adding said rounded down data to said increment data for outputting said rounded up data, and said output data selecting circuit includes a second selector circuit receiving said rounded down data and output data from said adding circuit for transmitting one of them to said output circuit to set it to each bit of said exponent portion and significand portion of said binary integer data in accordance with said combination of said sign of said input data and said integer representation signal, and a sign selector circuit for transmitting a same value as that of said sign bit of said input data to said output circuit as a sign bit of said binary integer data.

12. The floating point calculation unit according to claim 6, wherein said circuit for rounding down fractions below decimal point receives (M+N)th bit data corresponding to said exponent portion and significand portion of said input data and said calculation result X for setting a same value as that of a corresponding bit of said (M+N) bit data to a first bit to an (M+X)th bit of said rounded down data and setting 0 to an (M+X+1)th bit and following bits of said rounded down data; and said circuit for rounding up fractions below decimal point includes an increment data generating circuit outputting one of increment data of (M+N) bits having 1 at only an (M+X) bit when X is larger than 0 and 0 for all the other bits and dummy addition data of (M+N) bits having 0 at all bits in accordance with a combination of a sign of said input data and said integer representation designation signal, and an adding circuit adding said rounded down data to output data of said increment data generating circuit for outputting said rounded up data.

13. The floating point calculation unit according to claim 12, wherein said output data selecting circuit includes a first selector circuit receiving said first fixed value data and said second fixed value data for outputting one of them in accordance with said combination of said sign of said input data and said integer representation signal, and a second selector circuit receiving output data from said adding circuit and output data from said first selector circuit for transmitting one of them to set it to said each bit of said exponent portion and significand portion of said binary integer data, said second selector circuit outputting said output data from said adding circuit when said calculation result X is at least 0 and outputting said output data from said first selector circuit when said calculation result X is smaller than 0, and said output data selecting circuit further including a sign selector circuit for transmitting a same value as that of said sign bit of said input data to said output circuit as a sign bit of said binary integer data.

14. A semiconductor integrated circuit device performing a prescribed data process in accordance with an externally applied instruction signal, comprising:

an input/output circuit externally receiving/transmitting a signal;

a control circuit generating an internal control signal for performing a process corresponding to said instruction signal;

a memory circuit storing data;

a system bus transmitting said instruction signal and data to each circuit in said semiconductor integrated circuit device; and a dedicated calculating circuit having a function of converting binary floating point data into binary integer data in floating point notation, said dedicated calculating circuit including a logic circuit for controlling an operation of said dedicated calculating circuit in accordance with said internal control signal, a sub memory circuit storing said data in accordance with an instruction of said logic circuit, and a floating point calculation circuit for converting said binary floating point data into said binary integer data in accordance with said instruction of said logic circuit, said binary floating point data including a sign bit, an exponent portion of M bits (M: a natural number) and a significand portion of N bits (N: natural number), and said floating point calculation circuit including an input circuit receiving said binary floating point data as input data, an exponent portion calculating circuit for outputting a calculation result X (X: an integer) obtained by subtracting a prescribed bias value from a decimal number value corresponding to said exponent portion of said input data, an integer-represented data setting circuit for setting each bit of said binary integer data in accordance with said calculation result X, a sign of said input data and an integer representation signal designating by which one of rounding up and rounding down is to be performed on said input data, and an output circuit for outputting said binary integer data.

* * * * *